(12) United States Patent
Yaoi et al.

(10) Patent No.: US 7,203,118 B2
(45) Date of Patent: Apr. 10, 2007

(54) SEMICONDUCTOR STORAGE DEVICE AND MOBILE ELECTRONIC DEVICE

(75) Inventors: Yoshifumi Yaoi, Yamatokooriyama (JP); Hiroshi Iwata, Nara (JP); Akihide Shibata, Nara (JP); Masaru Nawaki, Nara (JP); Kei Tokui, Chiba (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 10/528,997

(22) PCT Filed: Sep. 10, 2003

(86) PCT No.: PCT/JP03/11559

§ 371 (c)(1),
(2), (4) Date: Jan. 20, 2006

(87) PCT Pub. No.: WO2004/029985

PCT Pub. Date: Apr. 8, 2004

(65) Prior Publication Data

US 2006/0109729 A1 May 25, 2006

(30) Foreign Application Priority Data

Sep. 26, 2002 (JP) ............................. 2002-280806
May 20, 2003 (JP) ............................. 2003-142146

(51) Int. Cl.
*G11C 5/14* (2006.01)
(52) U.S. Cl. .................. 365/226; 365/228; 365/185.18; 365/185.26; 365/189.09

(58) Field of Classification Search ................ 365/226, 365/228, 185.18, 185.26, 189.09
See application file for complete search history.

(56) References Cited

U.S. PATENT DOCUMENTS 5,403,764 A 4/1995 Yamamoto et al.

(Continued)

FOREIGN PATENT DOCUMENTS

JP 5-304277 A 11/1993

(Continued)

*Primary Examiner*—Tuan T. Nguyen
*Assistant Examiner*—Eric J. Wendler
(74) *Attorney, Agent, or Firm*—Birch, Stewart, Kolasch & Birch, LLP

(57) ABSTRACT

When an input voltage determining circuit 24 determines that an input voltage exceeds a prescribed voltage, a control circuit 25 of a positive polarity power selector circuit 22 turns on a first switch SW1 and turns off second and third switches SW2 and SW3, thereby supplying the input voltage to a memory cell array 21 via the first switch SW1. When the input voltage determining circuit 24 determines that the input voltage is not higher than the prescribed voltage, the control circuit 25 turns off the first switch SW1 and turns on the second and third switches SW2 and SW3, thereby supplying a voltage from a charge pump 23 via the second and third switches SW2 and SW3. By this operation, the memory element is able to retain storage of two bits or more even if miniaturized, to execute stable operation with a small circuit area and to prevent circuit malfunction attributed to a small current supplied to the memory cell array.

15 Claims, 19 Drawing Sheets

U.S. PATENT DOCUMENTS

| | | | |
|---|---|---|---|
| 5,426,391 A | | 6/1995 | Tedrow et al. |
| 5,430,402 A | | 7/1995 | Tedrow et al. |
| 5,627,493 A | * | 5/1997 | Takeuchi et al. ............ 327/546 |
| 5,740,109 A | * | 4/1998 | Morton et al. ......... 365/185.18 |
| 5,818,781 A | | 10/1998 | Estakhri et al. |
| 5,872,733 A | * | 2/1999 | Buti et al. ............. 365/185.19 |
| 6,084,387 A | | 7/2000 | Kaneko et al. |
| 6,141,262 A | * | 10/2000 | Sudo .................... 365/189.09 |
| 6,370,075 B1 | * | 4/2002 | Haeberli et al. ............ 365/226 |
| 2002/0033720 A1 | | 3/2002 | Ikehashi et al. |
| 2002/0040992 A1 | | 4/2002 | Manabe et al. |

FOREIGN PATENT DOCUMENTS

| | | |
|---|---|---|
| JP | 11-219596 A | 8/1999 |
| JP | 2000-500892 A | 1/2000 |
| JP | 2000-244298 A | 9/2000 |
| JP | 2002-50703 A | 2/2002 |
| JP | 2002-157894 A | 5/2002 |

* cited by examiner

SEMICONDUCTOR STORAGE DEVICE AND MOBILE ELECTRONIC DEVICE

TECHNICAL FIELD

The present invention relates to a semiconductor storage device and portable electronic equipment and more precisely to a semiconductor storage device provided with a memory cell array that employs field-effect transistors having a memory function as memory cells and portable electronic equipment that employs the semiconductor storage device.

BACKGROUND ART

Conventionally, a flash memory has typically been used as a nonvolatile semiconductor storage device.

In this flash memory, as shown in FIG. 28, a floating gate 902, an insulation film 907 and a word line (control gate) 903 are formed in this order via a gate insulation film 908 on a semiconductor substrate 901, and a source line 904 and a bit line 905 are formed on both sides of the floating gate 902, constituting a memory cell. Around this memory cell are formed element isolation regions 906 (refer to Japanese Patent Laid-Open Publication No. HEI 5-304277).

The memory cell retains storage as the quantity of charge in the floating gate 902. In the memory cell array constructed by arranging the memory cells, the desired memory cell can be subjected to rewrite and read operations by selecting the specified word line and bit line and applying a prescribed voltage to the lines.

The flash memory as described above exhibits a drain current Id to gate voltage Vg characteristic indicated by the solid line curve and the dashed line curve in FIG. 29 when the quantity of charges in the floating gate 902 changes. That is, if the quantity of negative charges in the floating gate 902 is increased, then the characteristic curve changes from the characteristic indicated by the solid line curve to the characteristic indicated by the broken line curve in FIG. 29, and the Id-Vg curve is displaced roughly parallel in a direction in which the gate voltage Vg increases with respect to same drain current Id, and the threshold voltage increases.

However, the flash memory as described above has been functionally required to arrange the insulation film 907 that isolates the floating gate 902 from the word line 903 and had difficulties in reducing the thickness of the gate insulation film to prevent the leak of charges from the floating gate 902. Therefore, it has been difficult to effectively reduce the thickness of the insulation film 907 and the gate insulation film, and this has hindered the miniaturization of the memory cell.

Therefore, the semiconductor storage device provided with the memory cell array that employs the aforementioned memory elements as memory cells has the problem that reliable operation cannot be assured with a further reduced circuit area.

Moreover, the semiconductor storage device that employs the aforementioned memory elements as memory cells in the memory cell array can also be sufficiently supplied with a current when an input voltage is supplied directly from the outside. However, it is sometimes the case where the input voltage largely fluctuates to fall below the desired voltage. Therefore, in order to supply an accurate voltage to the memory cell array, a charge pump is needed. However, there is a problem that the current tends to become insufficient via the charge pump, failing in achieving stable operation and leading to degraded reliability.

SUMMARY OF THE INVENTION

Accordingly, an object of the present invention is to provide a semiconductor storage device capable of retaining storage of two bits or more even when miniaturized and achieving stable operation with a small circuit area.

Another object of the present invention is to provide a semiconductor storage device capable of preventing the occurrence of circuit malfunction attributed to a small current supplied to the memory cell array.

Yet another object of the present invention is to provide portable electronic equipment capable of being reduced in size, improved in performance and reduced in manufacturing cost with the above-mentioned semiconductor storage device.

In order to achieve the above object, in the first inventive aspect, there is provided a semiconductor storage device having a memory cell array, which employs a memory element constructed of a gate electrode formed on a semiconductor layer via a gate insulation film, a channel region arranged under the gate electrode, diffusion regions that are arranged on both sides of the channel region and have a conductive type opposite to that of the channel region, and memory function bodies that are formed on both sides of the gate electrode and have a function to retain electric charges, as a memory cell, the semiconductor storage device comprising:

a first switch that has an input terminal to which an input voltage supplied from outside to the memory cell array is applied and has an output terminal connected to an input terminal of the memory cell array;

a second switch that has an input terminal to which the input voltage is applied;

a charge pump that has a pump input terminal connected to an output terminal of the second switch;

a third switch that has an input terminal connected to a pump output terminal of the charge pump and has an output terminal connected to the input terminal of the memory cell array;

an input voltage determining circuit that determines whether or not the input voltage is not higher than a prescribed voltage; and a control circuit that turns on the first switch and turns off the second and third switches when the input voltage determining circuit determines that the input voltage exceeds the prescribed voltage and turns off the first switch and turns on the second and third switches when the input voltage determining circuit determines that the input voltage is not higher than the prescribed voltage.

In this case, the memory function body has a function capable of injecting and extracting electrons or holes. According to the semiconductor storage device having the above construction, the field-effect transistor is operated as a memory element by converting the difference in the quantity of electric charges stored in the memory function body into a difference in the amount of current. If the input voltage determining circuit determines that the input voltage exceeds the prescribed voltage, then the control circuit turns on the first switch and turns off the second and third switches, thereby supplying the input voltage to the memory cell array via the first switch. If the input voltage determining circuit determines that the input voltage is not higher than the prescribed voltage, then the control circuit turns off the first switch and turns on the second and third switches, thereby supplying the voltage from the charge pump to the memory cell array via the third switch. Accordingly, there can be provided a semiconductor storage device capable of achieving the storage of two bits by using the memory element even if miniaturized, supplying sufficient current to the memory cell array and preventing the occurrence of circuit malfunction.

In one embodiment of the present invention, each of the first, second and third switches comprises:

a first P-channel field-effect transistor that has a source forming an input terminal;

a second P-channel field-effect transistor that has a drain connected to a drain of the first P-channel field-effect transistor and a source forming an output terminal;

a first voltage level shifter that selectively connects a gate of the first P-channel field-effect transistor to either its source or ground according to a control signal from the control circuit; and a second voltage level shifter that selectively connects a gate of the second P-channel field-effect transistor to either its source or ground according to a control signal from the control circuit.

According to the semiconductor storage device of the above-mentioned embodiment, the first, second and third switches are able to be provided with a small circuit area and to execute accurate circuit operation.

In one embodiment of the present invention, the prescribed voltage is a voltage within a range of +3 V to +12 V.

According to the semiconductor storage device of the above-mentioned embodiment, an appropriate voltage and a sufficient current can be supplied to the memory element that serves as the memory cell constituting the memory cell array.

In one embodiment of the present invention, the semiconductor storage device comprises:

a voltage polarity inverter circuit that has an input terminal connected to the output terminal of the first switch and inverts polarity of the voltage inputted to the input terminal to output the resulting voltage to the memory cell array.

According to the semiconductor storage device of the above-mentioned embodiment, in the case where no large current is required to be supplied when the negative voltage is supplied to the gate electrode during the erase of the memory element as the memory cell, by converting the positive voltage into the negative voltage by the voltage polarity inverter circuit and applying the positive voltage and the negative voltage to the drain electrode and the gate electrode, respectively, effective and reliable erase operation can be achieved with a small circuit area.

Also, in the second inventive aspect, there is provided a semiconductor storage device having a memory cell array, which employs a memory element constructed of a gate electrode formed on a semiconductor layer via a gate insulation film, a channel region arranged under the gate electrode, diffusion regions that are arranged on both sides of the channel region and have a conductive type opposite to that of the channel region, and memory function bodies that are formed on both sides of the gate electrode and have a function to retain electric charges, as a memory cell, a first switch that has an input terminal to which the input voltage of negative polarity supplied from outside to the memory cell array is applied and has an output terminal connected to the input terminal of the memory cell array;

a second switch that has an input terminal to which the input voltage of the negative polarity is applied;

a charge pump that has a pump input terminal connected to an output terminal of the second switch;

a third switch that has an input terminal connected to a pump output terminal of the charge pump and has an output terminal connected to the input terminal of the memory cell array;

an input voltage determining circuit that determines whether or not the input voltage is not lower than a prescribed voltage; and a control circuit that turns on the first switch and turns off the second and third switches when the input voltage determining circuit determines that the input voltage is lower than the prescribed voltage and turns off the first switch and turns on the second and third switches when the input voltage determining circuit determines that the input voltage is not lower than the prescribed voltage.

According to the semiconductor storage device of the above-mentioned construction, there are possessed similar operation and effects by the circuit construction similar to those of the semiconductor storage device of the first inventive aspect, and a sufficient current supply can be achieved when supplying the negative voltage to the memory cell array.

In one embodiment of the present invention, each of the first, second and third switches comprises:

a first N-channel field-effect transistor that has a source forming an input terminal;

a second N-channel field-effect transistor that has a drain connected to a drain of the first N-channel field-effect transistor and a source forming an output terminal;

a first voltage level shifter that selectively connects a gate of the first N-channel field-effect transistor to either its source or ground according to a control signal from the control circuit; and a second voltage level shifter that selectively connects a gate of the second N-channel field-effect transistor to either its source or ground according to a control signal from the control circuit.

According to the semiconductor storage device of the above-mentioned embodiment, the first, second and third switches are able to be provided with a small circuit area and to execute accurate circuit operation.

In one embodiment of the present invention, the prescribed voltage is a voltage within a range of −3 V to −12 V.

According to the semiconductor storage device of the above-mentioned embodiment, the supply of the negative voltage and a sufficient current appropriate for the memory element that serves as the memory cell constituting the memory cell array can be achieved.

Also, in the third inventive aspect, there is provided a semiconductor storage device having a memory cell array, which employs a memory element constructed of a gate electrode formed on a semiconductor layer via a gate insulation film, a channel region arranged under the gate electrode, diffusion regions that are arranged on both sides of the channel region and have a conductive type opposite to that of the channel region, and memory function bodies that are formed on both sides of the gate electrode and have a function to retain electric charges, as a memory cell, a first switch that has an input terminal to which an input voltage of positive polarity supplied from outside to the memory cell array is applied and has an output terminal connected to the input terminal of the memory cell array;

a second switch that has an input terminal to which the input voltage of the positive polarity is applied;

a first charge pump that has a pump input terminal connected to the output terminal of the second switch;

a third switch that has an input terminal connected to an output terminal of the first charge pump and has an output terminal connected to the input terminal of the memory cell array;

a first input voltage determining circuit that determines whether or not the input voltage of the positive polarity is not higher than a first prescribed voltage;

a first control circuit that turns on the first switch and turns off the second and third switches when the first input voltage determining circuit determines that the input voltage of the positive polarity exceeds the first prescribed voltage and turns off the first switch and turns on the second and third switches when the first input voltage determining circuit determines that the input voltage of the positive polarity is not higher than the first prescribed voltage;

a fourth switch that has an input terminal to which an input voltage of negative polarity supplied from outside to the memory cell array is applied and has an output terminal connected to the input terminal of the memory cell array;

a fifth switch that has an input terminal to which the input voltage of the negative polarity is applied;

a second charge pump that has a pump input terminal connected to an output terminal of the fifth switch;

a sixth switch that has an input terminal connected to an output terminal of the second charge pump and has an output terminal connected to the input terminal of the memory cell array;

a second input voltage determining circuit that determines whether or not the input voltage of the negative polarity is not lower than a second prescribed voltage; and a second control circuit that turns on the fourth switch and turns off the fifth and sixth switches when the second input voltage determining circuit determines that the input voltage of the negative polarity is lower than the second prescribed voltage and turns off the fourth switch and turns on the fifth and sixth switches when the second input voltage determining circuit determines that the input voltage of the negative polarity is not lower than the second prescribed voltage.

According to the semiconductor storage device of the above-mentioned construction, there are possessed similar operation and effects by the circuit construction similar to those of the semiconductor storage device of the first inventive aspect, and a sufficient current supply can be achieved when supplying the positive and negative voltages to the memory cell array.

In one embodiment of the present invention, each of the first, second and third switches comprises:

a first P-channel field-effect transistor that has a source forming an input terminal;

a second P-channel field-effect transistor that has a drain connected to a drain of the first P-channel field-effect transistor and a source forming an output terminal;

a first voltage level shifter that selectively connects a gate of the first P-channel field-effect transistor to either its source or ground according to a control signal from the first control circuit; and a second voltage level shifter that selectively connects a gate of the second P-channel field-effect transistor to either its source or ground according to a control signal from the first control circuit, wherein each of the fourth, fifth and sixth switches comprises:

a first N-channel field-effect transistor that has a source forming an input terminal;

a second N-channel field-effect transistor that has a drain connected to a drain of the first N-channel field-effect transistor and a source forming an output terminal;

a third voltage level shifter that selectively connects a gate of the first N-channel field-effect transistor to either its source or ground according to a control signal from the second control circuit; and a fourth voltage level shifter that selectively connects a gate of the second N-channel field-effect transistor to either its source or ground according to a control signal from the second control circuit.

According to the semiconductor storage device of the above-mentioned embodiment, the first through sixth switches are able to be provided with a small circuit area and to execute accurate circuit operation.

In one embodiment of the present invention, the prescribed first voltage is a voltage within a range of +3 V to +12 V, and the prescribed second voltage is a voltage within a range of −3 V to −12 V.

According to the semiconductor storage device of the above-mentioned embodiment, the supply of both the positive and negative voltages of appropriate voltages and a sufficient current can be achieved.

Also, in the fourth inventive aspect, there is provided a semiconductor storage device comprising:

a memory cell array;

a first switch that has an input terminal to which an input voltage supplied from outside to the memory cell array is applied and has an output terminal connected to an input terminal of the memory cell array;

a second switch that has an input terminal to which the input voltage is applied;

a charge pump that has a pump input terminal connected to an output terminal of the second switch;

a third switch that has an input terminal connected to a pump output terminal of the charge pump and has an output terminal connected to the input terminal of the memory cell array;

an input voltage determining circuit that determines whether or not the input voltage is not lower than a prescribed voltage; and a control circuit that turns on the first switch and turns off the second and third switches when the input voltage determining circuit determines that the input voltage is lower than the prescribed voltage and turns off the first switch and turns on the second and third switches when the input voltage determining circuit determines that the input voltage is not lower than the prescribed voltage.

According to the semiconductor storage device of the above-mentioned construction, if the input voltage determining circuit determines that the input voltage of the negative polarity is lower than the prescribed voltage, then the control circuit turns on the first switch and turns off the second and third switches, thereby supplying the input voltage of the negative polarity to the memory cell array via the first switch. If the input voltage determining circuit determines that the input voltage is not lower than the prescribed voltage, then the control circuit turns off the first switch and turns on the second and third switches, thereby supplying the negative voltage from the charge pump to the memory cell array via the third switch. Accordingly, there can be provided a semiconductor storage device capable of supplying a sufficient current to the memory cell array and preventing the occurrence of circuit malfunction when supplying the negative voltage to the memory cell array.

Also, in the fifth inventive aspect, there is provided a semiconductor storage device comprising:

a memory cell array;

a first switch that has an input terminal to which an input voltage of positive polarity supplied from outside to the memory cell array is applied and has an output terminal connected to the input terminal of the memory cell array;

a second switch that has an input terminal to which the input voltage of the positive polarity is applied;

a first charge pump that has a pump input terminal connected to the output terminal of the second switch;

a third switch that has an input terminal connected to an output terminal of the first charge pump and has an output terminal connected to the input terminal of the memory cell array;

a first input voltage determining circuit that determines whether or not the input voltage of the positive polarity is not higher than a first prescribed voltage;

a first control circuit that turns on the first switch and turns off the second and third switches when the first input voltage determining circuit determines that the input voltage of the positive polarity exceeds the first prescribed voltage and turns off the first switch and turns on the second and third switches when the first input voltage determining circuit determines that the input voltage of the positive polarity is not higher than the first prescribed voltage;

a fourth switch that has an input terminal to which an input voltage of negative polarity supplied from outside to the memory cell array is applied and has an output terminal connected to the input terminal of the memory cell array;

a fifth switch that has an input terminal to which the input voltage of the negative polarity is applied;

a second charge pump that has a pump input terminal connected to an output terminal of the fifth switch;

a sixth switch that has an input terminal connected to an output terminal of the second charge pump and has an output terminal connected to the input terminal of the memory cell array;

a second input voltage determining circuit that determines whether or not the input voltage of the negative polarity is not lower than a second prescribed voltage; and a second control circuit that turns on the fourth switch and turns off the fifth and sixth switches when the second input voltage determining circuit determines that the input voltage of the negative polarity is lower than the second prescribed voltage and turns off the fourth switch and turns on the fifth and sixth switches when the second input voltage determining circuit determines that the input voltage of the negative polarity is not lower than the second prescribed voltage.

According to the semiconductor storage device of the above-mentioned construction, if the first input voltage determining circuit determines that the input voltage of the positive polarity exceeds the first prescribed voltage, then the first control circuit turns on the first switch and turns off the second and third switches, thereby supplying the input voltage of the positive polarity to the memory cell array via the first switch. If the first input voltage determining circuit determines that the input voltage of the positive polarity is not higher than the first prescribed voltage, then the first control circuit turns off the first switch and turns on the second and third switches, thereby supplying the positive voltage from the first charge pump to the memory cell array via the third switch. Moreover, if the second input voltage determining circuit determines that the input voltage of the negative polarity is lower than the second prescribed voltage, then the second control circuit turns on the fourth switch and turns off the fifth and sixth switches, thereby supplying the input voltage of the negative polarity to the memory cell array via the fourth switch. If the second input voltage determining circuit determines that the input voltage of the negative polarity is not lower than the second prescribed voltage, then the second control circuit turns off the fourth switch and turns on the fifth and sixth switches, thereby supplying the negative voltage from the charge pump to the memory cell array via the sixth switch. Accordingly, there can be provided a semiconductor storage device capable of supplying a sufficient current to the memory cell array and preventing the occurrence of circuit malfunction when supplying the positive and negative voltages to the memory cell array.

In one embodiment of the present invention, at least part of the memory function bodies owned by the memory element overlaps with part of the diffusion region.

In one embodiment of the present invention, the semiconductor storage device comprises: an insulation film, which separates a film, that has a surface roughly parallel to a surface of the gate insulation film of the memory element and has a function to retain electric charges, from the channel region or the semiconductor layer, the insulation film having a film thickness thinner than a film thickness of the gate insulation film and being not smaller than 0.8 nm.

According to the semiconductor storage device of the above-mentioned embodiments, by reducing the voltages for the write and erase operations of the memory element, the film thickness of the gate insulation film is not required to be thick in order to cope with a high voltage dissimilarly to the conventional case. Therefore, the short-channel effect of the transistors that constitute the memory elements and the circuit to operate the memory elements is reduced. Consequently, the transistors that constitute the memory elements and the circuit to operate the memory elements are allowed to have a channel length shorter than in the conventional case.

Moreover, the area of the capacitor included in the charge pump device can be reduced.

Therefore, the circuit area of the semiconductor storage device can be largely reduced.

In one embodiment of the present invention, a portable electronic equipment has the above-mentioned semiconductor storage device.

According to the portable electronic equipment having the above-mentioned construction, there is provided the semiconductor storage device that can retain the storage of two bits or more per transistor and is easy to miniaturize. An appropriate voltage having a sufficient current can be supplied during the write operation and the erase operation into the memory cell array that employs the memory element as a memory cell. Therefore, the reliability of the portable electronic equipment can be improved without malfunction, and the manufacturing cost can be reduced by miniaturization.

DETAILED DESCRIPTION OF THE INVENTION

Figure 1:
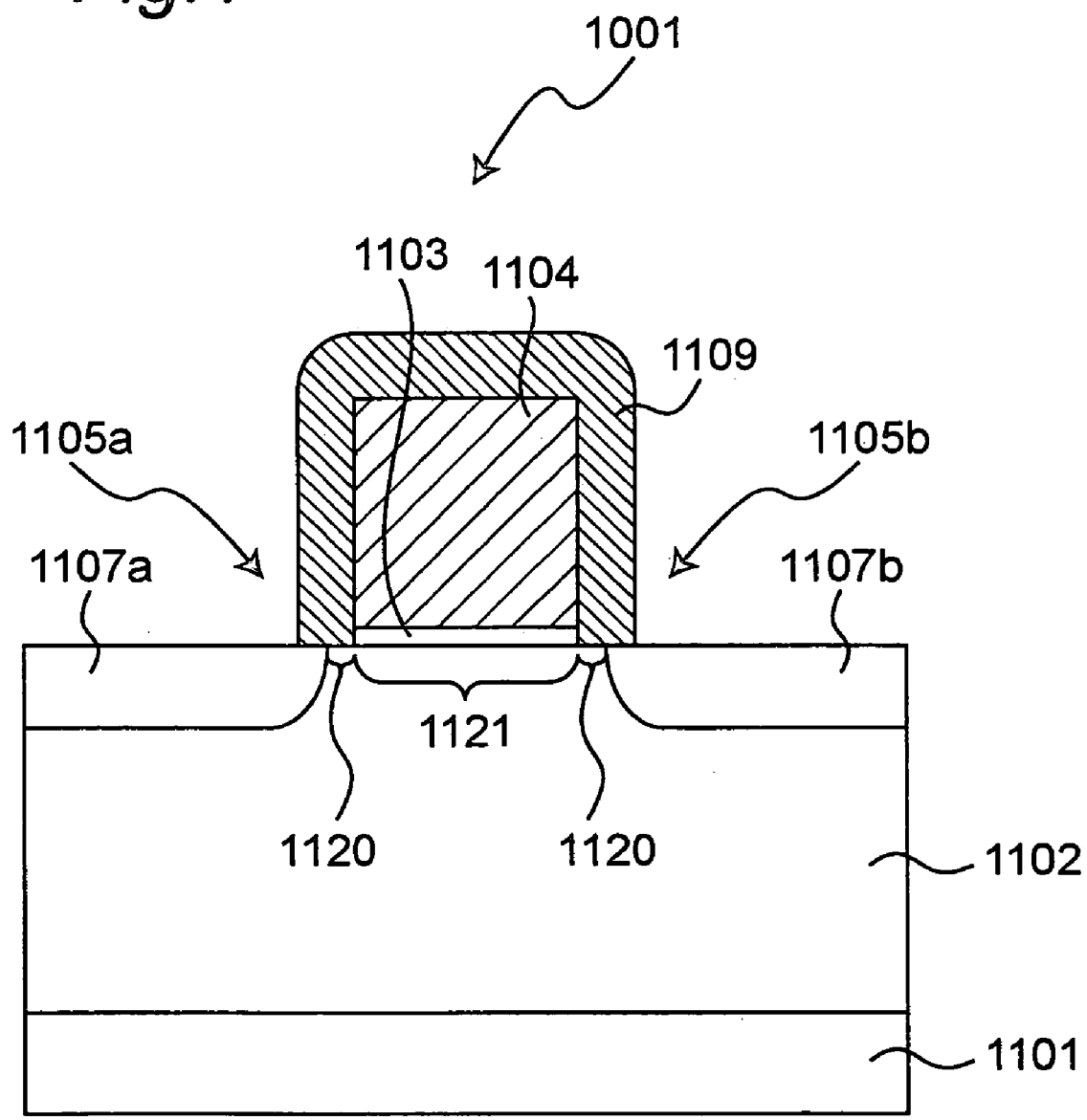
FIG. 1 is a schematic sectional view of the essential part of a memory element in the semiconductor storage device of the first embodiment of the present invention.

An outline of a nonvolatile memory element to be employed in the semiconductor storage device of the present invention will be described first.

The memory element is constructed mainly of a semiconductor layer, a gate insulation film, a gate electrode, a channel region, a diffusion region and a memory function body. In this case, the channel region generally means a region of the same conductive type as that of the semiconductor layer, or a region right under the gate electrode, while the diffusion region means a region of the conductive type opposite to that of the channel region.

In concrete, the memory element of the present invention, which may be constructed of one first conductive type region that is the diffusion region, a second conductive type region that is the channel region, one memory function body arranged across regions of the first and second conductive types, and an electrode provided via the gate insulation film, should properly be constructed of a gate electrode formed on the gate insulation film, two memory function bodies formed on both sides of the gate electrode, two diffusion regions arranged on both sides of the memory function body oppositely to the gate electrode, and a channel region arranged under the gate electrode.

The semiconductor device of the present invention should be formed as a semiconductor layer on a semiconductor substrate or preferably formed on a well region of the first conductive type formed in the semiconductor substrate.

The semiconductor substrate is not specifically limited so long as it is used for a semiconductor device, and there can be enumerated, for example, bulk substrates of elemental semiconductors of silicon, germanium and so on and compound semiconductors of silicon germanium, GaAs, InGaAs, ZnSe, GaN and so on. Moreover, it is acceptable to employ various substrates such as an SOI (Silicon on Insulator) substrate, an SOS (Silicon on Sapphire) substrate and a multi-layer SOI substrate and a glass or plastic substrate on which a semiconductor layer is possessed, as those which have a semiconductor layer on its surface. Among others, a silicon substrate, an SOI substrate on the surface of which a silicon layer is formed or the like, is preferable. The semiconductor substrate or the semiconductor layer may be single crystal (by, for example, epitaxial growth), polycrystal or amorphous although there are variations in the quantity of current flowing inside.

It is preferred that an element isolation region is formed on this semiconductor layer, and a single or multi-layer structure may be formed by a combination of the elements of transistors, capacitors, resistors and so on, circuits of these elements, semiconductor devices and layer insulation films. The element isolation region can be formed of various element isolation films such as a LOCOS (Local Oxidation of Silicon) film, a trench oxide film and an STI (Shallow Trench Isolation) film. The semiconductor layer may have the P-type or the N-type conductive type, and it is preferred that a well region of at least one first conductive type (P-type or N-type) be formed on the semiconductor layer. There can be employed a semiconductor layer and a well region whose impurity concentrations are within the ranges well known in the field. When the SOI substrate is employed as a semiconductor layer, a well region may be formed on the surface semiconductor layer, or a body region may be possessed under the channel region.

The gate insulation film is generally not specifically limited so long as it is used for a semiconductor device, and there can be employed: for example, an insulation film such as a silicon oxide film and a silicon nitride film; a single layer film or a laminate film of a high dielectric film such as an aluminum oxide film, a titanium oxide film, a tantalum oxide film and a hafnium oxide film. Among others, the silicon oxide film is preferable. The gate insulation film should have a film thickness of, for example, about 1 to 20 nm and preferably have a film thickness of about 1 to 6 nm. The gate insulation film may be formed only right under the gate electrode or formed larger (wider) than the gate electrode.

The gate electrode is formed on the gate insulation film normally in a shape for use in a semiconductor device or a shape that has a concave portion in a lower end portion. The gate electrode, which should preferably be formed in an integrated body without being separated by a single layer or multi-layer conductive film, may be arranged in a separated state by the single layer or multi-layer conductive film. Moreover, the gate electrode may have a side wall insulation film on the side wall. The gate electrode is normally not specifically limited so long as it is used for a semiconductor device, and there can be enumerated the conductive films of: for example, polysilicon; metals of copper and aluminum; high-melting-point metals of tungsten, titanium and tantalum; a single layer film or a multilayer film of high-melting-point metal and silicide thereof; and so on. The gate electrode should properly be formed with a film thickness of, for example, about 50 to 400 nm. It is to be noted that a channel region is formed under the gate electrode.

It is preferred that the gate electrode is formed only on the side wall of the memory function body described later or does not cover the upper portion of the memory function body. With this arrangement, a contact plug can be arranged closer to the gate electrode, and therefore, the miniaturization of the memory element is facilitated. Moreover, the memory element, which has a simple arrangement as described above, is easy to manufacture, and the yield can be improved.

The memory function body has at least a function to retain electric charges (hereinafter referred to as a "charge retention function"). In other words, the memory function body has a function to store and retain charges, trap charges or retain a charge polarized state. This function is fulfilled by the memory function body that includes, for example, a film or region having the charge retention function. As a material that fulfills this function, there can be enumerated: silicon nitride; silicon; silicate glass containing impurities of phosphorus, boron or the like; silicon carbide; alumina; high dielectric materials of hafnium oxide, zirconium oxide, tantalum oxide and the like; zinc oxide; ferroelectric substance; metal and so on. Therefore, the memory function body can be formed of a single layer or laminate structure of: an insulation film including a silicon nitride film; an insulation film including a conductive film or a semiconductor layer inside; an insulation film including at least one conductor or semiconductor dot; or an insulation film including a ferroelectric film in which internal charges are polarized by an electric field and the state is retained. Among others, the silicon nitride film, in which a number of levels for trapping charges exist, is therefore able to obtain a great hysteresis characteristic. Moreover, a charge retention time is long, and there occurs no problem of charge leak due to the generation of a leak path, and therefore, a retention characteristic is satisfactory. Furthermore, a silicon nitride film is preferable because it is normally used in the LSI process.

By employing the insulation film, which internally includes the film having the charge retention function, such as a silicon nitride film, as a memory function body, reliability of storage retention can be improved. The reason for the above is that the silicon nitride film is an insulator and the electric charges of the entire silicon nitride film are not lost at once even when the charge leak partially occurs in the film. Moreover, even if a distance between memory elements is reduced and mutually adjacent memory function bodies are brought in contact with each other when a plurality of memory elements are arranged, the information stored in each of the memory function bodies is not lost dissimilarly to the case where the memory function bodies are constructed of a conductor. Furthermore, the contact plug can be arranged closer to the memory function body and arranged so as to overlap with the memory function body in some cases. Therefore, the miniaturization of the memory element is facilitated.

In order to improve the reliability of storage retention, the film that has the charge retention function is not always required to have a film-like shape, and a film having the charge retention function should preferably exist discretely in the insulation film. In concrete, it is preferred that the film having the charge retention function is distributed in a dot-like form in a material that hardly retains electric charges, or, for example, silicon oxide.

When a conductive film or a semiconductor layer is employed as a charge retaining film, it is preferable to arrange the charge retaining film via an insulation film so as not to come in direct contact with neither one of the semiconductor layer (semiconductor substrate, well region, body region, source/drain region or diffusion region) and the gate electrode. As the insulation film, for example, there can be enumerated a laminate structure of a conductive film and an insulation film, a structure in which a conductive film is distributed in a dot-like form in the insulation film, a structure arranged in a part of the side wall insulation film formed on the side wall of the gate and so on.

By employing the insulation film that internally include a conductive film or a semiconductor layer as a memory function body, the amount of electric charges to be injected into the conductor or the semiconductor can be freely controlled, and a multi-value arrangement can easily be provided. Therefore, this arrangement is preferable.

Furthermore, by employing the insulation film that includes at least one conductor or semiconductor dots as a memory function body, the write and erase operations can easily be executed by direct tunneling of electric charges, and low power consumption can be achieved. Therefore, this arrangement is preferable.

Moreover, it is acceptable to use a ferroelectric film such as PZT (lead zirconate titanate) and PLZT (lead lanthanum zirconate titanate) whose polarization direction is changed by an electric field as a memory function body. In this case, electric charges are substantially generated by polarization on the surface of the ferroelectric film and retained in the state. Therefore, electric charges are supplied from outside the film that has the memory function, and a hysteresis characteristic similar to that of the film that traps electric charges can be obtained. In addition, since there is no need to inject electric charges from outside the film and the hysteresis characteristic can be obtained only by the polarization of the electric charges in the film, high-speed write and erase can be achieved. Therefore, this arrangement is preferable.

The insulation film, which constitutes the memory function body, should properly be a region for making it difficult for electric charges to escape or a film that has a function to make it difficult for electric charges to escape. As one that fulfills the function to make it difficult for electric charges to escape, a silicon oxide film and so on can be enumerated.

The charge retaining film included in the memory function body is arranged on both sides of the gate electrode directly or via an insulation film and arranged on the semiconductor layer (semiconductor substrate, well region, body region or source/drain region or diffusion region) directly or via a gate insulation film. It is preferred that the charge retaining films located on both sides of the gate electrode be formed so as to cover the whole or part of the side walls of the gate electrode directly or via an insulation film. According to an example of application, when the gate electrode has a concave portion in its lower end portion, the charge retaining film may be formed so as to be completely or partially buried in the concave portion directly or via an insulation film.

The diffusion region can be made to function as a source/drain region and has a conductive type opposite to that of the semiconductor layer or the well region. A junction of the diffusion region and the semiconductor layer or the well region should preferably have a steep slope of impurity concentration. The reason for the above is that hot electrons and hot holes are efficiently generated at a low voltage, and high-speed operation can be achieved at a lower voltage. The junction depth of the diffusion region is not specifically limited and is allowed to be properly adjusted according to the performance and so on of the semiconductor storage device desired to be obtained. When a SOI substrate is employed as a semiconductor substrate, the diffusion region may have a junction depth smaller than the film thickness of the surface semiconductor layer. However, the diffusion region should preferably have a junction depth almost equal to the film thickness of the surface semiconductor layer.

The diffusion region may be arranged so as to overlap with the gate electrode end or arranged so as to meet the gate electrode end or arranged so as to be offset with respect to the gate electrode end. In particular, in the case of offset, the easiness of inversion of the offset region under the charge retaining film is largely changed by the quantity of charges accumulated in the memory function body when the voltage is applied to the gate electrode, increasing the memory effect and reducing the short-channel effect. Therefore, this arrangement is preferable. However, since a drive current between the diffusion regions (source and drain) is significantly reduced if the offset is excessive, it is preferred that the amount of offset, i.e., a distance from one gate electrode end to the nearer diffusion region in the direction of the gate length should preferably be shorter than the thickness of the charge retaining film in the direction parallel to the gate length direction. What is particularly important is that at least part of the film or region having the charge retention function in the memory function body overlaps with part of the diffusion region. The reason for the above is that the essence of the memory elements that constitute the semiconductor storage device of the present invention is to rewrite the storage by the electric field intersecting the memory function body due to a voltage difference between the gate electrode and the diffusion region existing only in the side wall portion of the memory function body.

The diffusion region may be partially extended to a position higher than the surface of the channel region, i.e., the lower surface of the gate insulation film. In this case, it is proper that a conductive film integrated with this diffusion region is constructed while being laminated on the diffusion region formed in the semiconductor substrate. As the conductive film, there can be enumerated, for example, semiconductor of polysilicon, amorphous silicon or the like, silicide, aforementioned metals, high-melting-point metals and so on. Among others, polysilicon is preferable. The reason for the above is that the polysilicon, of which the impurity diffusion speed is significantly greater than that of the semiconductor layer, easily tolerates a shallowed junction depth of the diffusion region in the semiconductor layer and easily suppresses a short-channel effect. In this case, it is preferable to provide an arrangement that part of this diffusion region and the gate electrode hold at least part of the memory function body therebetween.

The memory element of the present invention can be formed by the ordinary semiconductor process according to a method similar to the method of forming a side wall spacer of a single layer or laminate structure on the side wall of the gate electrode. In concrete, there can be enumerated: a method for forming a gate electrode, thereafter forming a single layer film or a multilayer film including a film having the charge retention function (hereinafter referred to as a "charge retaining film"), a charge retaining film such as a charge retaining film/insulation film, an insulation film/charge retaining film and an insulation film/charge retaining film/insulation film and leaving these films in a side wall spacer shape by etching back under appropriate conditions; a method for forming an insulation film or a charge retaining film, leaving the films in a side wall spacer shape by etching back under appropriate conditions, further forming a charge retaining film or an insulation film and leaving the films in a side wall spacer shape by etching back under appropriate conditions; a method for coating or depositing an insulation film material in which a particulate charge retaining material is distributed on a semiconductor layer including a gate electrode, and leaving the insulation film material in a side wall spacer shape by etching back under appropriate conditions; a method for forming a gate electrode, thereafter forming the single layer film or the multilayer film and carrying out patterning by using a mask and so on. Moreover, there can be enumerated a method for forming a charge retaining film, a charge retaining film/insulation film, an insulation film/charge retaining film, an insulation film/charge retaining film/insulation film and so on before forming the gate electrode, forming an opening in a region that becomes a channel region of these films, forming a gate electrode material film on the entire upper surface and patterning this gate electrode material film in a shape, which is larger than the opening and includes the opening and so on.

One example of the formation process of this memory element will be described.

First of all, a gate insulation film and a gate electrode are formed on a semiconductor substrate according to a well-known procedure. Subsequently, a silicon oxide film is formed by the thermal oxidation method to a film thickness of 0.8 to 20 nm, or more preferably to a film thickness of 3 to 10 nm or deposited by the CVD (Chemical Vapor Deposition) method on the entire upper surface of the semiconductor substrate. Next, a silicon nitride film is deposited by the CVD method to a film thickness of 2 to 15 nm or more preferably to a film thickness of 3 to 10 nm on the entire upper surface of the silicon oxide film. Further, a silicon oxide film is deposited to a film thickness of 20 to 70 nm on the entire surface of the silicon nitride film by the CVD method.

Subsequently, by etching back the silicon oxide film/silicon nitride film/silicon oxide film by anisotropic etching, a memory function body appropriate for storage is formed in a side wall spacer shape on the side wall of the gate electrode.

Subsequently, by injecting ions using the gate electrodes and the memory function body in the side wall spacer shape used as a mask, a diffusion layer region (source/drain region) is formed. Subsequently, it is proper to carry out a silicide process or an upper portion wiring process according to a well-known procedure.

When a memory cell array is constructed by arranging the memory elements of the present invention, the best mode of the memory elements is to satisfy, for example, all the required conditions:

(1) the function of the word line is possessed by the integrated body of the gate electrodes of a plurality of memory elements;

(2) the memory function bodies are formed on both sides of the word line;

(3) electric charges in the memory function bodies are retained by an insulator, or in particular, a silicon nitride film;

(4) the memory function bodies are constructed of an ONO (Oxide Nitride Oxide) film, and the silicon nitride film has a surface roughly parallel to the surface of the gate insulation film;

(5) the silicon nitride film in each memory function body is separated by the word line, the channel region and the silicon oxide film;

(6) the silicon nitride film in each memory function body overlaps with the diffusion region;

(7) the thickness of the insulation film, which separates the silicon nitride film that has a surface roughly parallel to the surface of the gate insulation film from the channel region or the semiconductor layer differs from the thickness of the gate insulation film;

(8) write and erase operations of one memory element are executed by a single word line;

(9) there is no electrode (word line) that has a function to assist the write and erase operations on each memory function body; and

(10) the portion put in contact with the diffusion region right under each memory function body has a region where the impurity concentration of the conductive type opposite to the conductive type of the diffusion region is high. It is to be noted that the memory elements may satisfy at least one of these requirements.

The most preferable combination of the aforementioned requirements resides, for example, in that (3) electric charges in the memory function bodies are retained by an insulator, or in particular, a silicon nitride film, (6) the insulation film (silicon nitride film) in each memory function body overlaps with the diffusion region, and (9) there is no electrode (word line) that has a function to assist the write and erase operations on each memory function body.

When the requirement (3) and the requirement (9) are satisfied, the memory elements are very useful as follows. First of all, a bit line contact can be arranged closer to the memory function body located on the word line side wall, or even if the memory elements are put close to each other in distance, the plurality of memory function bodies do not interfere with one another, and the storage information can be retained. Therefore, the miniaturization of the memory elements is facilitated. When the charge retaining region in the memory function body is a conductor, interference occurs between the charge retaining regions as the distance between the memory elements is reduced by capacitive coupling, and the storage information cannot be retained.

Moreover, when the charge retaining region in the memory function body is an insulator (e.g., silicon nitride film), there is no need to make each memory function body independent of each memory cell. For example, the memory function bodies formed on both sides of one word line shared by a plurality of memory cells are not required to be isolated every memory cell, and it is possible to share the memory function bodies formed on both sides of one word line by a plurality of memory cells that share the word line. Therefore, the photoetching process for isolating the memory function bodies become unnecessary, and the manufacturing process is simplified. Furthermore, the position alignment margin of the photolithography process and the film etching margin become unnecessary. Therefore, the margin between the memory cells can be reduced. Therefore, even if the formation is carried out on the same microfabrication level, the memory cell occupation area can be miniaturized in comparison with the case where the charge retaining region in the memory function body is a conductor (e.g., polycrystalline silicon film). When the charge retaining region in the memory function body is a conductor, there is needed a photoetching process for separating the memory function bodies every memory cell, and there are needed a photo position alignment margin and a film etching margin.

Furthermore, since there is a simple element structure that has no electrode having the function to assist the write and erase operations on the memory function bodies, the number of processes is reduced, and the yield can be improved. Therefore, consolidation with the transistors that constitute a logic circuit and an analog circuit can be facilitated, and an inexpensive semiconductor storage device can be obtained.

Moreover, the device is more useful when the requirements (3) and (9) are satisfied and the requirement (6) is satisfied. That is, by making the charge retaining region and the diffusion region in each memory function body overlap with each other, the write and erase operations can be executed at a very low voltage. In concrete, the write and erase operations can be executed at a low voltage of not higher than 5 V. This operation produces a very large effect in terms of circuit design. There is no need to make a high voltage in a chip dissimilarly to the flash memory, and therefore, the charge pump circuit, which requires an enormous occupation area, can be eliminated or reduced in scale. Particularly, when a small-scale capacity memory for adjustment is built in a logic LSI, the occupation area of the memory section is dominated by the occupation area of the peripheral circuit for driving the memory cells than the memory cells. Therefore, it is most effective to eliminate or reduce the scale of the memory cell voltage booster circuit in order to reduce the chip size.

When the requirement (3) is not satisfied or when electric charges are retained by a conductor in the memory function body, the write operation can be executed even when the requirement (6) is not satisfied, or when the conductor in the memory function body and the diffusion region do not overlap with each other. This is because the conductor in the memory function body executes write assist by capacitive coupling with the gate electrode.

Moreover, when the requirement (9) is not satisfied, or when there is an electrode that has the function to assist the write and erase operations on the memory function body, the write operation can be executed even when the requirement (6) is not satisfied, or when the insulator in the memory function body and the diffusion region do not overlap with each other.

In the semiconductor storage device of the present invention, the memory element may be connected in series to a transistor on one side or both sides or consolidated with a logic transistor on an identical chip. In the above case, the semiconductor device of the present invention, or in particular, the memory element can be formed through processes that has very high affinity for the formation processes of ordinary standard transistors of transistors, logic transistors and the like, and therefore, they can be concurrently formed. Therefore, the process of consolidating the memory elements with the transistors or the logic transistors becomes very simple, and an inexpensive consolidated device can be obtained.

In the semiconductor storage device of the present invention, the memory element can store binary or more information in one memory function body, and this allows the element to function as a memory element that stores four values or more information. The memory element may store only binary information. Moreover, it is possible to make the memory element function as a memory cell that has both the functions of a select transistor and a memory transistor by the variable resistor effect of the memory function body.

By being combined with a logic element, a logic circuit or the like, the semiconductor storage device of the present invention can be effectively widely applied to data processing systems of personal computers, notebook type computers, laptop type computers, personal assistant/transmitters, mini computers, workstations, mainframes, multi-processor computers or any other types of computers; electronic components that constitute a data processing system, such as CPU's, memories and data storage devices; communication equipment such as telephones, PHS's (Personal Handy phone Systems), modems and routers; image display equipment such as display panels and projectors; business machines such as printers, scanners and copiers; imaging equipment such as video cameras and digital cameras; amusement equipment such as game machines and music players; information equipment of portable information terminals, watches and electronic dictionaries; car equipment such as car navigation systems and car audio devices; AV (Audio Visual) equipment for recording and reproducing information of animations, still pictures and music; electrical appliances such as washing machines, microwave ovens, refrigerators, rice cookers, dish washers, vacuum cleaners and air conditioners; healthcare equipment such as massage machines, scales and sphygmomanometers; and electronic equipment such as portable storage devices of IC cards, memory cards and so on. In particular, the applications to the portable electronic equipment of portable telephones, portable information terminals, IC cards, memory cards, portable computers, portable game machines, digital cameras, portable animation players, portable music players, electronic dictionaries and watches are effective. It is to be noted that the semiconductor storage device of the present invention may be integrated as at least part of the control circuit of electronic equipment or a data storage circuit or detachably integrated at need.

Embodiments of the semiconductor storage device and the portable electronic equipment of the present invention will be described in detail below with reference to the drawings.

(First Embodiment)

The semiconductor storage device of this embodiment is provided with a memory element 1001 that serves as one example of the nonvolatile memory element as shown in FIG. 1.

In the memory element 1001, a gate electrode 1104 is formed on a P-type well region 1102 formed via a gate insulation film 1103 on the surface of a semiconductor substrate 1101. A silicon nitride film 1109, which has a trap level for retaining electric charges and serves as a charge retaining film, is arranged on the upper surface and the side surfaces of the gate electrode 1104, and the portions of the silicon nitride film 1109 located on both side walls of the gate electrode 1104 serve as memory function bodies 1105a and 1105b for actually retaining electric charges. In this case, the memory function body means a portion where electric charges are actually accumulated by the rewrite operation in the memory function body or the charge retaining film. N-type diffusion regions 1107a and 1107b, which function as a source region and a drain region, respectively, are formed on both sides of the gate electrode 1104 and inside the P-type well region 1102. The diffusion regions 1107a and 1107b have an offset structure. That is, the diffusion regions 1107a and 1107b do not reach the region 1121 located under the gate electrode, and the offset regions 1120 under the charge retaining film (silicon nitride film 1109) constitute part of the channel region.

Figure 2A:
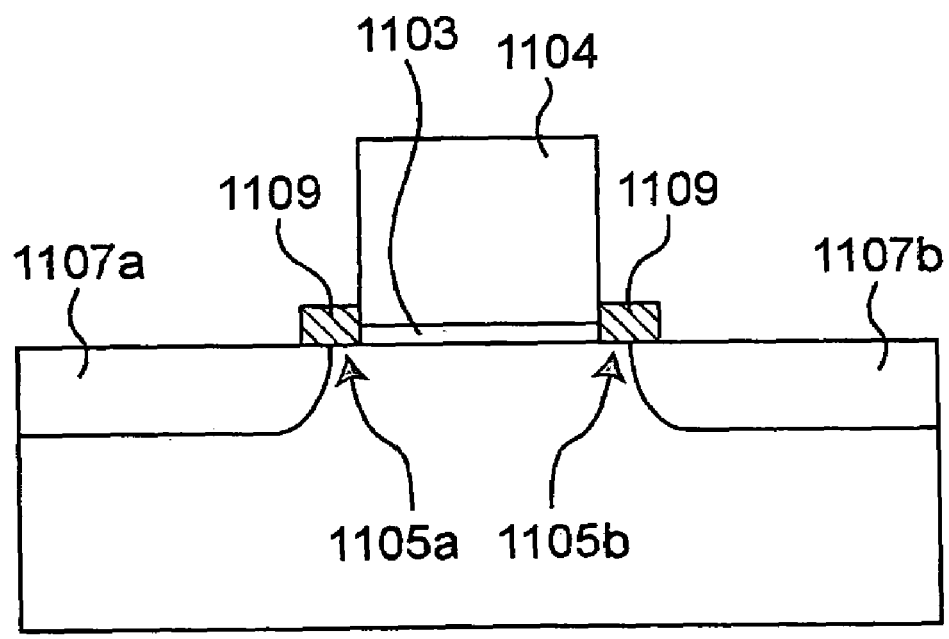
FIGS. 2A and 2B are schematic sectional views of the essential part of memory elements in the semiconductor storage device of the modified first embodiment of the present invention.
Figure 2B:
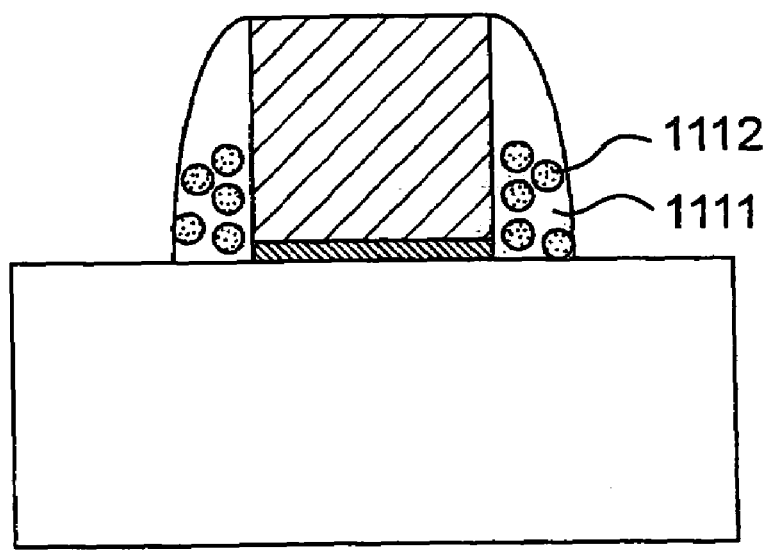

It is to be noted that the memory function bodies 1105a and 1105b, which substantially retain electric charges, are both sides wall portions of the gate electrode 1104. Therefore, the silicon nitride film 1109 is only required to be formed in the regions corresponding to these portions (see FIG. 2A). Moreover, the memory function bodies 1105a and 1105b may have a structure in which particles 1112 constructed of a conductor or a semiconductor of a nanometer size are distributed in scattered dots in an insulation film 1111 (see FIG. 2B). In this case, it is difficult for an electric charge to tunnel its way through the dots since the quantum effect is excessive when the particle 1112 has a size smaller than 1 nm, and no remarkable quantum effect appears at the room temperature when the size exceeds 10 nm. Therefore, the diameter of the particle 1112 should preferably be within a range of 1 nm to 10 nm. Furthermore, the silicon nitride films 1109, which become charge retaining films, may be formed in a side wall spacer shape on the side surfaces of the gate electrode (see FIG. 3).

The principle of write operation of the memory element will be described with reference to FIG. 3 and FIG. 4. In this case, the description is based on the case where the entire bodies of the memory function bodies 1131a and 1131b have a function to retain electric charges. Moreover, the term of "write" means the injection of electrons into the memory function bodies 1131a and 1131b when the memory element is the N-channel type. Hereinafter, the description is provided on the assumption that the memory element is the N-channel type.

Figure 3:
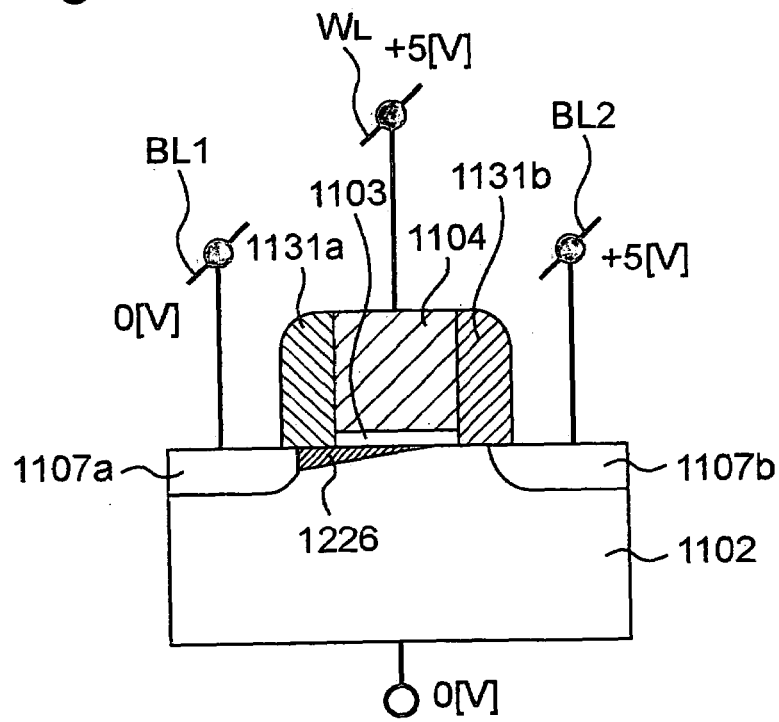
FIG. 3 is a view for explaining the write operation of the memory element in the semiconductor storage device of the first embodiment.

In order to inject an electron (execute write) into the second memory function body 1131b, as shown in FIG. 3, an N-type first diffusion region 1107a and an N-type second diffusion region 1107b are made to serve as a source electrode and a drain electrode, respectively. For example, a voltage of 0 V is applied to the first diffusion region 1107a and the P-type well region 1102, a voltage of +5 V is applied to the second diffusion region 1107b, and a voltage of +5 V is applied to the gate electrode 1104. According to the above-mentioned voltage conditions, an inversion layer 1226 extends from the first diffusion region 1107a (source electrode), but it does not reach the second diffusion region 1107b (drain electrode), generating a pinch-off point. An electron is accelerated from the pinch-off point to the second diffusion region 1107b (drain electrode) by a high electrical field and becomes a so-called hot electron (high energy conduction electron). Write is executed by the injection of this hot electron into the second memory function body 1131b. Since no hot electron is generated in the vicinity of the first memory function body 1131a, write is not executed.

Figure 4:
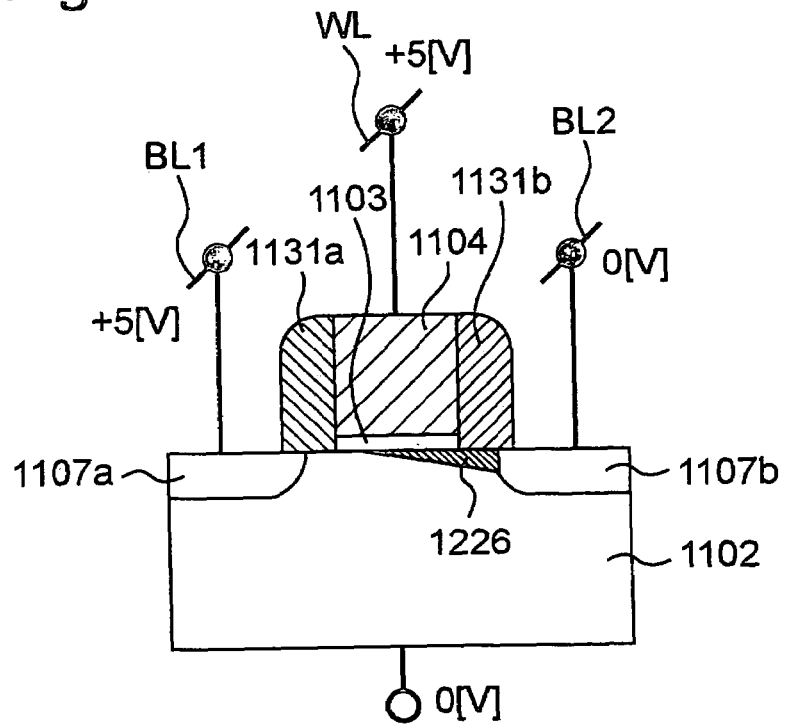
FIG. 4 is a view for explaining the write operation of the memory element in the semiconductor storage device of the first embodiment.

On the other hand, in order to inject an electron (execute write) into the first memory function body 1131a, as shown in FIG. 4, the second diffusion region 1107b and the first diffusion region 1107a are made to serve as the source electrode and the drain electrode, respectively. For example, a voltage of 0 V is applied to the second diffusion region 1107b and the P-type well region 1102, a voltage of +5 V is applied to the first diffusion region 1107a, and a voltage of +5 V is applied to the gate electrode 1104. As described above, by exchanging the source and drain regions reversely to the case where an electron is injected into the second memory function body 1131b, write can be executed by injecting an electron into the first memory function body 1131a.

Next, the principle of erase operation of the memory element will be described with reference to FIG. 5 and FIG. 6.

Figure 5:
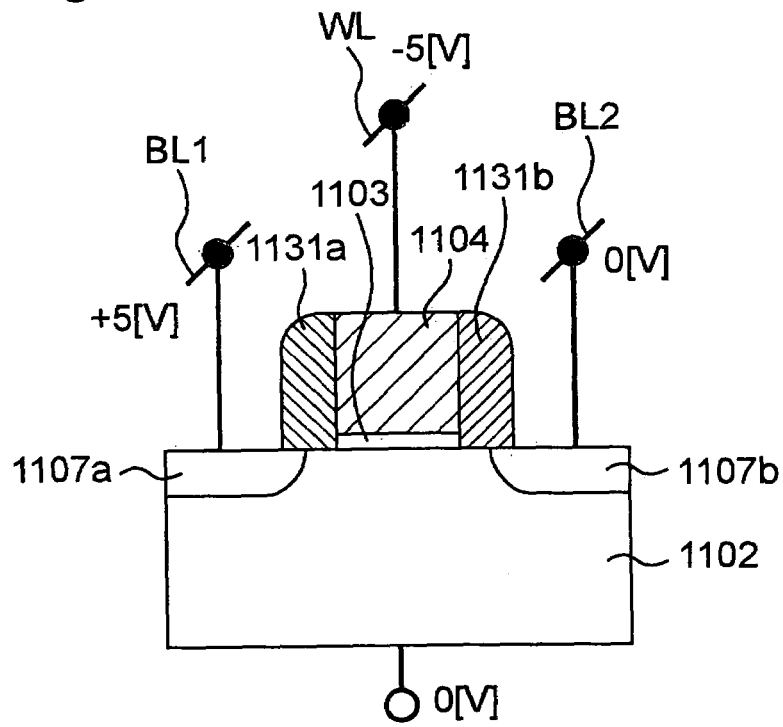
FIG. 5 is a view for explaining the erase operation of the memory element in the semiconductor storage device of the first embodiment.

According to a first method for erasing the information stored in the first memory function body 1131a, as shown in FIG. 5, a positive voltage (e.g., +5 V) is applied to the first diffusion region 1107a, a voltage of 0 V is applied to the P-type well region 1102, a reverse bias is applied to a PN junction of the first diffusion region 1107a and the P-type well region 1102, and a negative voltage (e.g., −5 V) is further applied to the gate electrode 1104. At this time, the potential slope becomes steep, in particular, in the vicinity of the gate electrode 1104 at the PN junction due to the influence of the gate electrode to which the negative voltage is applied. Accordingly, a hot hole (high energy hole) is generated on the P-type well region 1102 side of the PN junction due to band-to-band tunneling. This hot hole is drawn toward the gate electrode 1104 that has a negative potential, and consequently, the hole is injected into the first memory function body 1131a. As described above, the erase of the first memory function body 1131a is executed. In this case, it is proper to apply a voltage of 0 V to the second diffusion region 1107b.

When erasing the information stored in the second memory function body 1131b, it is proper to exchange the potential of the first diffusion region with the potential of the second diffusion region in the aforementioned case.

Figure 6:
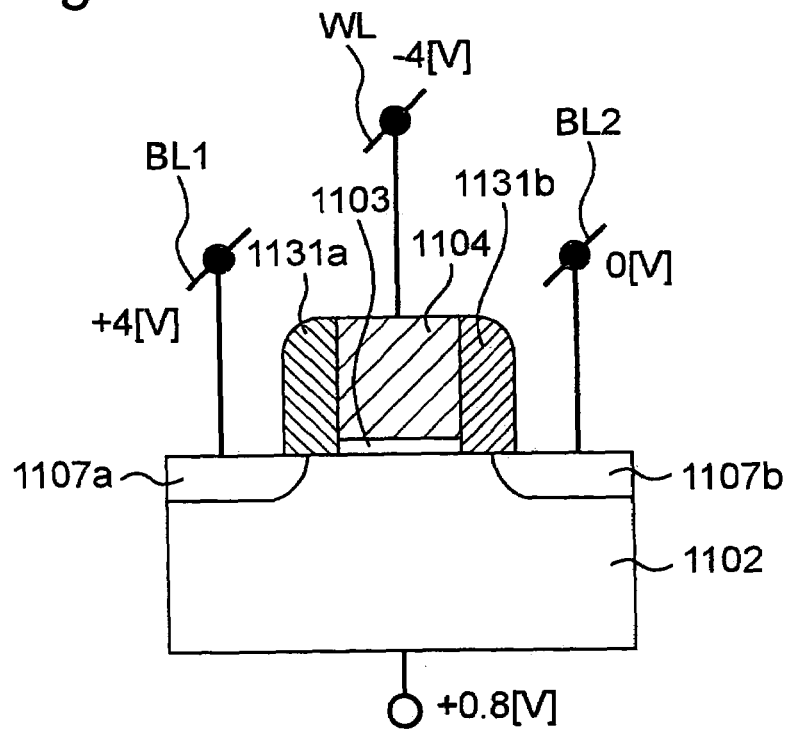
FIG. 6 is a view for explaining the erase operation of the memory element in the semiconductor storage device of the first embodiment.

According to a second method for erasing the information stored in the first memory function body 1131a, as shown in FIG. 6, a positive voltage (e.g., +4 V) is applied to the first diffusion region 1107a, a voltage of 0 V is applied to the second diffusion region 1107b, a negative voltage (e.g., −4 V) is applied to the gate electrode 1104, and a positive voltage (e.g., +0.8 V) is applied to the P-type well region 1102. In this case, a forward voltage is applied across the P-type well region 1102 and the second diffusion region 1107b, injecting an electron into the P-type well region 1102. The injected electron diffuses to a PN junction of the P-type well region 1102 and the first diffusion region 1107a and become hot electrons by being accelerated there by an intense electric field. This hot electron generates an electron-hole pair at the PN junction. That is, by applying the forward voltage across the P-type well region 1102 and the second diffusion region 1107b, the electron injected into the P-type well region 1102 becomes a trigger to generate a hot hole at the PN junction located on the opposite side. The hot hole generated at the PN junction is drawn toward the gate electrode 1104 that has a negative potential, and consequently, the hole is injected into the first memory function body 1131a.

According to this method, even when only a voltage insufficient for the generation of a hot hole by band-to-band tunneling is applied to the PN junction of the P-type well region and the first diffusion region 1107a, the electron injected from the second diffusion region 1107b becomes a trigger to generate an electron-hole pair at the PN junction, allowing a hot hole to be generated. Therefore, the voltage during the erase operation can be lowered. Particularly, when an offset region 1120 (see FIG. 1) exists, the effect that the PN junction becomes steep due to the gate electrode to which the negative potential is applied is a little, and therefore, it is difficult to generate a hot hole by band-to-band tunneling. The second method makes up for the defect, and the erase operation can be achieved at a low voltage.

In erasing the information stored in the first memory function body 1131a, a voltage of +5 V must to be applied to the first diffusion region 1107a according to the first erase method, whereas a voltage of +4 V is sufficient according to the second erase method. As described above, according to the second method, the voltage during erase can be reduced. Therefore, power consumption is reduced, and the deterioration of the memory element due to the hot carrier can be restrained.

Moreover, by either one of the erase methods, overerase does not easily occur in the memory element. The term of "overerase" here is a phenomenon that the threshold value is lowered without saturation as the amount of holes accumulated in the memory function body increases. This is a serious problem in EEPROM (Electrically Erasable Programmable Read-Only Memory) represented by a flash memory, and there occurs a fatal malfunction that memory cell selection becomes impossible particularly when the threshold value becomes negative. On the other hand, in the memory element of the semiconductor storage device of the present invention, only electrons are induced under the memory function bodies even when a large amount of holes are accumulated in the memory function body, and almost no influence is exerted on the potential of the channel region under the gate insulation film. The threshold value during erase is determined by the potential under the gate insulation film, and therefore, overerase does not easily occur.

Figure 7:
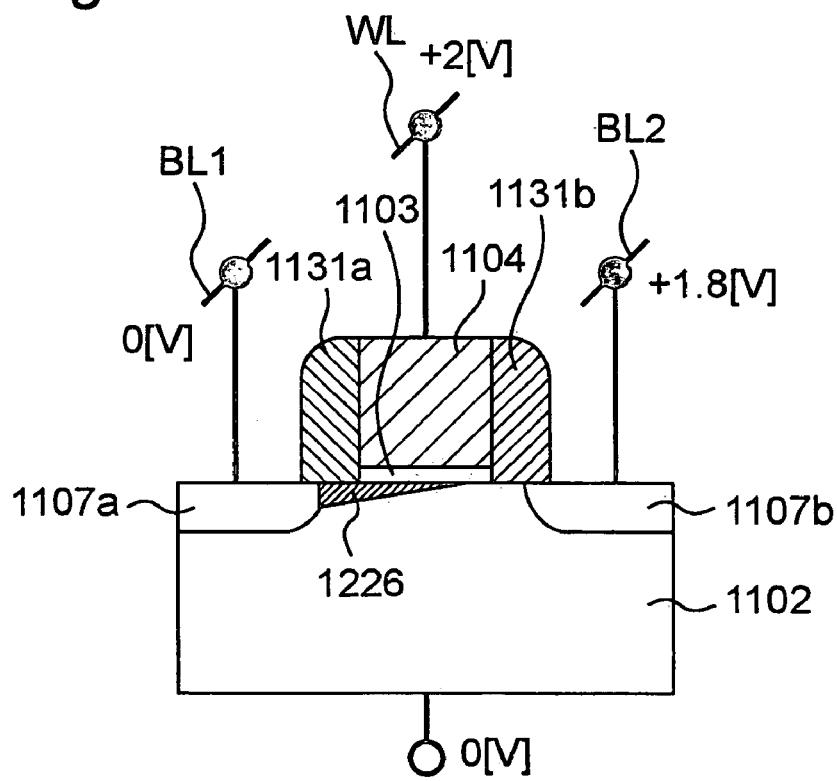
FIG. 7 is a view for explaining the read operation of the memory element of the semiconductor storage device of the first embodiment.

The principle of read operation of the memory element will be further described with reference to FIG. 7.

In reading the information stored in the first memory function body 1131a, the transistor is operated by making the first diffusion region 1107a and the second diffusion region 1107b serve as a source electrode and a drain electrode, respectively. For example, a voltage of 0 V is applied to the first diffusion region 1107a and the P-type well region 1102, a voltage of +1.8 V is applied to the second diffusion region 1107b, and a voltage of +2 V is applied to the gate electrode 1104. In this case, when no electron is accumulated in the first memory function body 1131a, a drain current easily flows. When electrons are accumulated in the first memory function body 1131a, the inversion layer is not easily formed in the vicinity of the first memory function body 1131a, and therefore, a drain current hardly flows. Therefore, by detecting the drain current, the storage information of the first memory function body 1131a can be read. In particular, when read is executed by giving a voltage that causes the pinch-off operation, the state of charges accumulated in the first memory function body 1131*a* can be more accurately determined without being influenced by the presence or absence of charges in the memory function body 1131*b*.

In reading the information stored in the second memory function body 1131*b*, the transistor is operated by making the second diffusion region 1107*b* and the first diffusion region 1107*a* serve as the source electrode and the drain electrode, respectively. Although not shown, it is proper to apply, for example, a voltage of 0 V to the second diffusion region 1107*b* and the P-type well region 1102, apply a voltage of +1.8 V to the first diffusion region 1107*a* and apply a voltage of +2 V to the gate electrode 1104. As described above, by exchanging the source and drain regions reversely to the case where the information stored in the first memory function body 1131*a* is read, the information stored in the second memory function body 1131*b* can be read.

If the channel region (offset regions 1120) that is not covered with the gate electrode 1104 is left, then the inversion layer is lost or formed depending on the presence or absence of surplus electric charges of the memory function bodies 1131*a* and 1131*b* in the channel region that is not covered with the gate electrode 1104, and consequently, a great hysteresis (a change in the threshold value) is obtained. It is to be noted that the drain current is largely reduced when the width of the offset region 1120 is excessively large, and the read speed is significantly slowed. Therefore, it is preferable to determine the width of the offset region 1120 so that sufficient hysteresis and read speed can be obtained.

Even when the diffusion regions 1107*a* and 1107*b* reached the ends of the gate electrode 1104, i.e., even when the diffusion regions 1107*a* and 1107*b* and the gate electrode 1104 overlapped with each other, the threshold value of the transistor was scarcely changed by the write operation. However, a parasitic resistance at the ends of the source and drain is largely changed, and the drain current is largely reduced (by an order of magnitude or more). Therefore, read can be executed by detecting the drain current, and a function as a memory can be obtained. However, when a larger memory hysteresis effect is needed, it is preferred that the diffusion regions 1107*a* and 1107*b* do not overlap with the gate electrode 1104 (the offset region 1120 exists).

By the aforementioned operation method, 2-bit write and erase per transistor can be selectively achieved. Moreover, by arranging memory elements with a word line WL connected to the gate electrodes 1104 of the memory elements and with a first bit line BL1 and a second bit line BL2 connected to the first diffusion regions 1107*a* and the second diffusion regions 1107*b*, respectively, a memory cell array can be constructed.

Moreover, according to the aforementioned operation method, the 2-bit write and erase per transistor are executed by exchanging the source electrode with the drain electrode. However, the device may be operated as a 1-bit memory by fixing the source electrode and the drain electrode. In this case, it is possible to make one of the source and drain regions have a common fixed voltage, and the number of bit lines connected to the source and drain regions can be reduced by half.

As is apparent from the above description, in the memory element of the semiconductor storage device of the present invention, the memory function bodies are formed independently of the gate insulation film and formed on both sides of the gate electrode, and therefore, the 2-bit operation can be achieved. Moreover, the memory function bodies are separated by the gate electrode, and therefore, interference during rewrite is effectively restrained. Furthermore, the gate insulation film, which is separated from the memory function body, can therefore restrain the short-channel effect by being reduced in film thickness. Therefore, the miniaturization of the memory element and also the semiconductor storage device is facilitated.

Moreover, in the drawings, the same reference numerals are given to the portions where the same material and substances are used and do not necessarily indicate the same shapes.

Moreover, it is to be noted that the drawings are schematic, and the dimensional relations between thickness and plane, ratios of thickness and size between layers and portions and so on are different from those of the actual ones. Therefore, the concrete dimensions of thickness and size should be determined in consideration of the following description. Moreover, there are, of course, included the portions whose mutual dimensional relations and ratios are different between the figures.

Moreover, the thickness and the size of the layers and portions described in the present patent specification are the dimensions of the final shapes in the stage in which the formation of the semiconductor device is completed unless specifically described. Therefore, it is to be noted that the dimensions of the final shapes somewhat change depending on the thermal history and so on of the subsequent processes in comparison with the dimensions immediately after the formation of the films, the impurity regions and so on.

(Second Embodiment)

Figure 8:
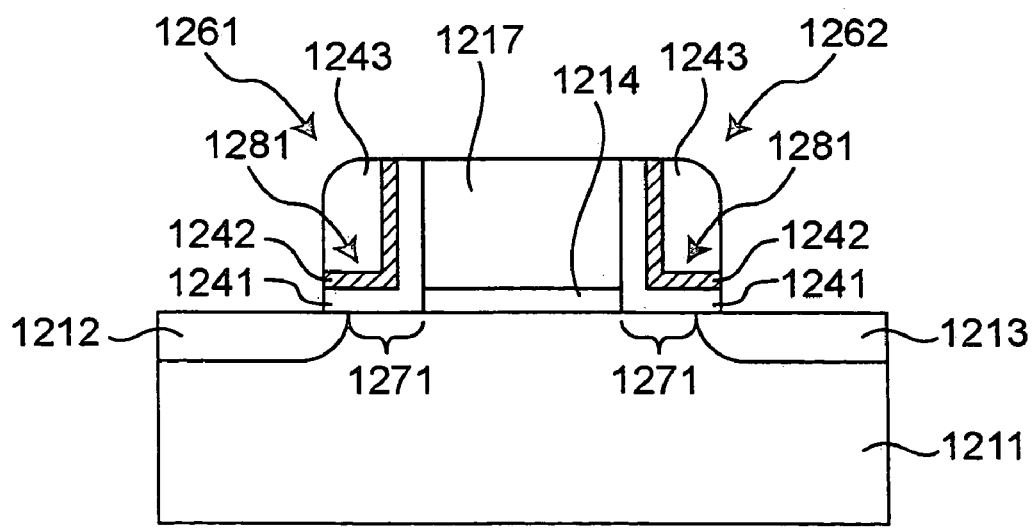
FIG. 8 is a schematic sectional view of the essential part of a memory element in the semiconductor storage device of the second embodiment of the present invention.

As shown in FIG. 8, the memory element in the semiconductor storage device of the present embodiment has a construction substantially similar to that of the memory element 1001 of FIG. 1 except for the memory function bodies 1261 and 1262 are constructed of a region for retaining electric charges (this may be a region for storing electric charges, or a film having the function to retain electric charges) and a region for restraining the escape of electric charges (this may be a film that has a function to restrain the escape of electric charges).

From the point of view of improving the retention characteristic of the memory, the memory function body should preferably include a charge retaining film having the function to retain electric charges and an insulation film. This embodiment employs a silicon nitride film 1242 that has a level for trapping electric charges as a charge retaining film and silicon oxide films 1241 and 1243 that have the operation of preventing the dissipation of electric charges accumulated in the charge retaining film as an insulation film. By the memory function body that including the charge retaining film and the insulation film, the retention characteristic can be improved by preventing the dissipation of electric charges. Moreover, the volume of the charge retaining film can be moderately reduced in comparison with the case where the memory function body is constructed only of the charge retaining film, and the occurrence of a characteristic change due to the movement of electric charges during the retention of the storage can be restrained by limiting the movement of electric charges in the charge retaining film. Furthermore, with the structure in which the silicon nitride film 1242 is held between the silicon oxide films 1241 and 1243, charge injection efficiency during the rewrite operation is increased, and higher-speed operation becomes possible. In this memory element, the silicon nitride film 1242 may be replaced by a ferroelectric substance.

Also, the region (silicon nitride film 1242) for holding electric charges in the memory function bodies 1261, 1262 are overlapped with the diffusion layer regions 1212, 1213.

Herein, the term "overlap" is used to refer to the state that at least part of the region (silicon nitride film 1242) for holding electric charges is present on at least part of the diffusion layer regions 1212, 1213. It is noted that there are shown a semiconductor substrate 1211, a gate insulating film 1214, and an offset region 1271 between the gate electrode 1217 and the diffusion layer regions 1212, 1213. Though unshown in the drawing, the uppermost surface of the semiconductor substrate 1211 under the gate insulating film 1214 is a channel region.

An effect produced by the arrangement that the silicon nitride film 1242 serving as the region for retaining electric charges in the memory function bodies 1261 and 1262 overlap with the diffusion regions 1212 and 1213 will be described.

Figure 9:
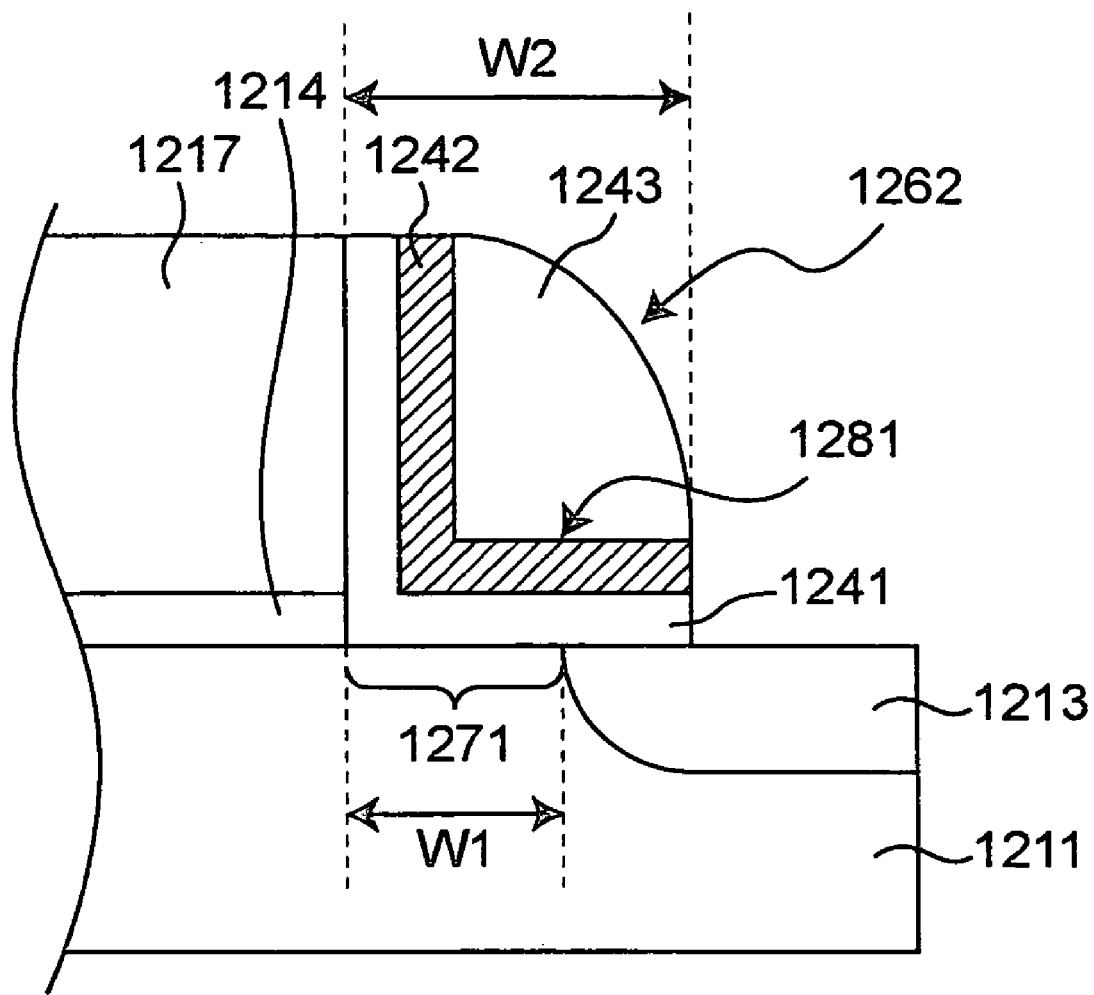
FIG. 9 is an enlarged schematic sectional view of the essential part of the semiconductor storage device of the second embodiment.

As shown in FIG. 9, assuming that the amount of offset of a gate electrode 1217 with respect to a diffusion region 1213 is W1 and that the width of a memory function body 1262 in a cross-sectional plane in the channel-length direction of the gate electrode 1217 is W2 in the peripheral portions of the memory function body 1262, then the amount of overlap of the memory function body 1262 with the diffusion region 1213 is expressed by W2−W1. What is important here is that the memory function body 1262 constructed of the silicon nitride film 1242 of the memory function body 1262 overlaps with the diffusion region 1213, i.e., the arrangement that the relation: W2>W1 is satisfied.

In FIG. 9, the end of the silicon nitride film 1242 remote from the gate electrode 1217 coincided with the end of the memory function body 1262 remote from the gate electrode 1217 at the memory function body 1262. Therefore, the width of the memory function body 1262 was defined as W2.

Figure 10:
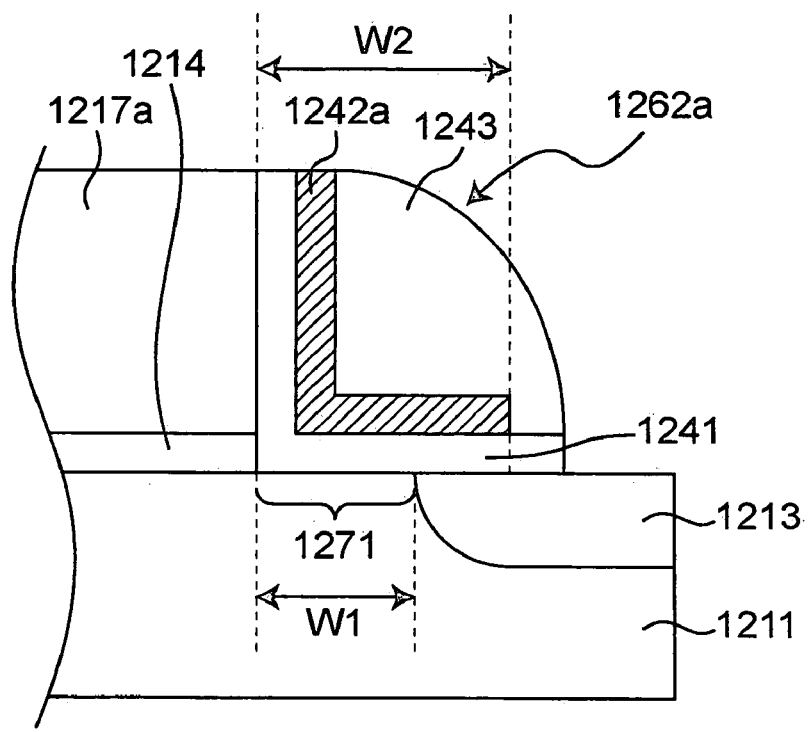
FIG. 10 is an enlarged schematic sectional view of the essential part of the semiconductor storage device of the modified second embodiment.

In the case where an edge of a silicon nitride film 1242a on the side away from the gate electrode in a memory function body 1262a is not aligned with an edge of the memory function body 1262a on the side away from the gate electrode as shown in FIG. 10, W2 may be defined as the width from the edge of the gate electrode to the edge of the silicon nitride film 1242a on the side away from the gate electrode.

Figure 11:
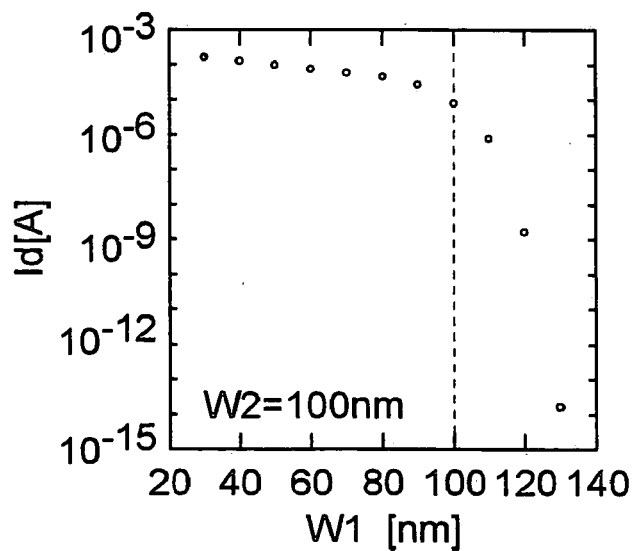
FIG. 11 is a graph showing the electrical characteristic of the memory element in the semiconductor storage device of the second embodiment.

FIG. 11 shows a drain current Id in the structure of FIG. 9 with the width W2 of the memory function body 1262 being fixed to 100 nm and the offset amount W1 being varied. Herein, the drain current is obtained by device simulation performed under the conditions that the memory function body 1262 is in erase state (positive holes are stored), and the diffusion layer regions 1212, 1213 are set to be a source electrode and a drain electrode, respectively. As shown in FIG. 11, with W1 being 100 nm or more (i.e., when the silicon nitride film 1242 and the diffusion layer region 1213 are not overlapped), the drain current shows rapid reduction. Since a drain current value is almost in proportion to a read operation speed, memory performance is rapidly deteriorated when W1 is 100 nm or more. In the range where the silicon nitride film 1242 and the diffusion layer region 1213 are overlapped, the drain current shows mild reduction. Therefore, taking a manufacturing dispersion into consideration, it is difficult to obtain a memory function unless at least part of the silicon nitride film 1242 that is a film having a function of holing electric charges is overlapped with the source/drain region.

Based on the above-described result of the device simulation, a memory cell array is manufactured with W2 being fixed to 100 nm, and W1 being set to 60 nm and 100 nm as design values. When W1 is 60 nm, the silicon nitride film 1242 is overlapped with the diffusion layer regions 1212, 1213 by 40 nm as a design value, and when W1 is 100 nm, there is no overlap as a design value. As a result of measuring read time of these memory cell arrays in comparison with the worst cases in consideration to dispersion, it was found out that the case where W1 was 60 nm as a design value was 100 times faster in readout access time. From a practical standpoint, it is preferable that the read access time is 100 nanoseconds or less per bit. It was found out, however, that this condition was never satisfied in the case of W1=W2. It was also found out that W2−W1>10 nm was more preferable in consideration to manufacturing dispersion.

It is preferable for reading information stored in the memory function body 1261 (region 1281) to set the diffusion layer region 1212 as a source electrode and the diffusion layer region 1213 as a drain region similar to the embodiment 1 and to form a pinchoff point on the side closer to the drain region in the channel region. More specifically, in reading information stored in either one of two memory function bodies, the pinch-off point is preferably formed in a region closer to the other memory function body in the channel region. This makes it possible to detect memory information in the memory function body 1261 with good sensitivity regardless of the storage condition of the memory function body 1262, resulting in large contribution to implementation of two-bit operation.

In the case of storing information only in one side out of the two memory function bodies, or in the case of using these two memory function bodies in the same storing condition, an pinch-off point is not necessarily formed in read operation.

Although not shown in FIG. 8, a well region (P type well in the case of N-channel device) is preferably formed on the surface of the semiconductor substrate 1211. Forming the well region facilitates control of other electric characteristics (withstand voltage, junction capacitance, and short channel effect) while maintaining impurity concentration of the channel region optimum for memory operation (rewrite operation and read operation).

Figure 12:
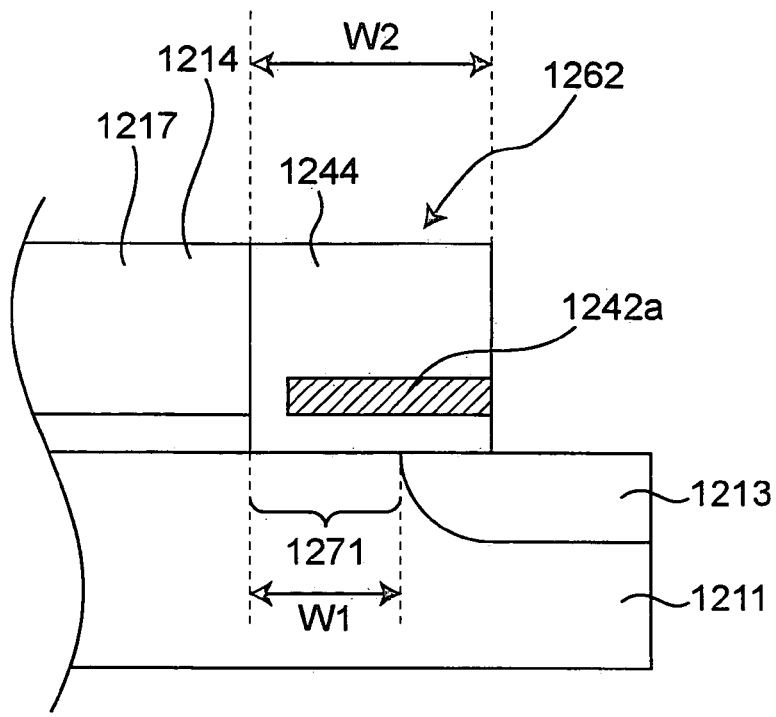
FIG. 12 is a schematic sectional view of the essential part of a memory element in the semiconductor storage device of the modified second embodiment of the present invention.

Also, it is preferable that the memory function body contains a charge holding film disposed approximately parallel to the surface of the gate insulating film. In other words, it is preferable that the surface of the charge holding film in the memory function body is disposed so as to have a constant distance from the surface of the gate insulating film. More particularly, as shown in FIG. 12, a silicon nitride film 1242a as an electric holding film in the memory function body 1262 has a face approximately parallel to the surface of the gate insulating film 1214. In other words, the silicon nitride film 1242a is preferably formed to have a uniform height from the height corresponding to the surface of the gate insulating film 1214.

The presence of the silicon nitride film 1242a approximately parallel to the surface of the gate insulating film 1214 in the memory function body 1262 makes it possible to effectively control easiness of formation of an inversion layer in the offset region 1271 with use of an amount of electric charges stored in the charge holding film 1242a, thereby enabling increase of memory effect. Also, by placing the silicon nitride film 1242a approximately parallel to the surface of the gate insulating film 1214, change of memory effect may be kept relatively small even with a dispersed offset amount (W1), enabling restraint of memory effect dispersion. In addition, movement of electric charges toward upper side of the silicon nitride film 1242a may be suppressed, and therefore characteristic change due to the movement of electric charges during memory holding may be restrained.

Furthermore, the memory function body 1262 preferably contains an insulating film (e.g., a portion of the silicon oxide film 1244 on the offset region 1271) that separates the silicon nitride film 1242a approximately parallel to the surface of the gate insulating film 1214 from the channel region (or the well region). This insulating film may restrain dispersion of the electric charges stored in the charge holding film, thereby contributing to obtaining a memory device with better holding characteristics.

It is noted that controlling the film thickness of the silicon nitride film 1242a as well as controlling the film thickness of the insulating film under the silicon nitride film 1242a (a portion of the silicon oxide film 1244 on the offset region 1271) to be constant make it possible to keep the distance from the surface of the semiconductor substrate to the electric charges stored in the charge holding film approximately constant. More particularly, the distance from the surface of the semiconductor substrate to the electric charges stored in the charge holding film may be controlled to be within the range from a minimum film thickness value of the insulating film under the silicon nitride 1242a to the sum of a maximum film thickness of the insulating film under the silicon nitride film 1242a and a maximum film thickness of the silicon nitride film 1242a. Consequently, the concentration of electric line of force generated by the electric charges stored in the silicon nitride film 1242a may be roughly controlled, and therefore dispersion of the degree of memory effect of the memory device may be minimized.

(Third Embodiment)

Figure 13:
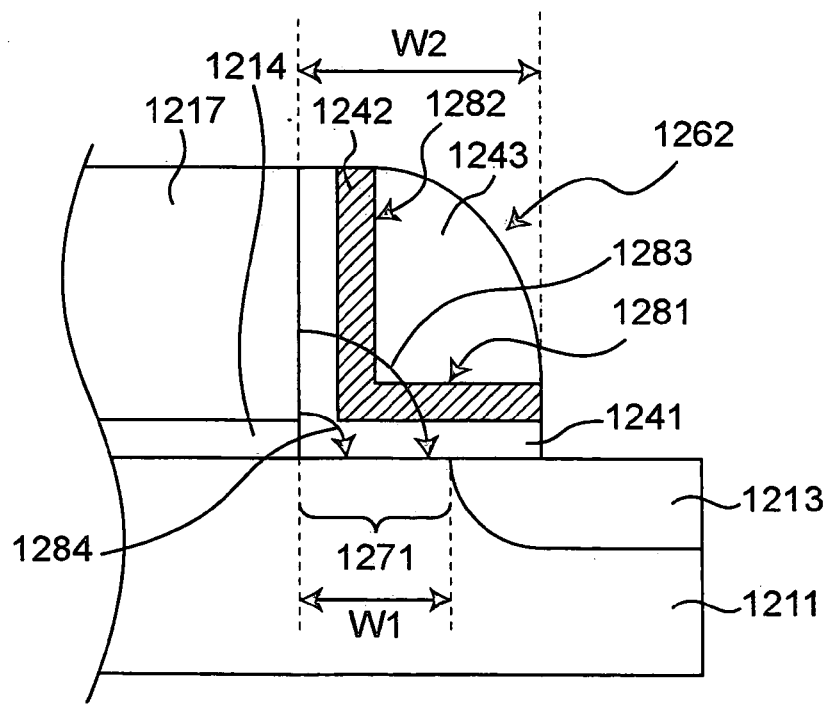
FIG. 13 is a schematic sectional view of the essential part of a memory element in the semiconductor storage device of the third embodiment of the present invention.

In this embodiment, a silicon nitride film 1242 as a film made of a first insulator in the charge holding portion 1262 has an approximately uniform film thickness as shown in FIG. 13. Further, the silicon nitride film 1242 as a charge holding film is configured such that a region 1281 having a constant thickness and disposed approximately parallel to the surface of the gate insulating film 1214 and a region 1282 extending in direction approximately parallel to the side face of the gate electrode 1217.

When a positive voltage is applied to the gate electrode 1217, electric line of force in the memory function body 1262 passes the silicon nitride film 1242 total two times through the first portion 1281 and the second portion 1282 as shown with an arrow 1283. It is noted that when a negative voltage is applied to the gate electrode 1217, the direction of electric line of force is reversed. Herein, a dielectric constant of the silicon nitride film 1242 is approx. 6, while a dielectric constant of silicon oxide films 1241, 1243 is approx. 4. Eventually, an effective dielectric constant of the memory function body 1262 in the direction of electric line of force (arrow 1283) becomes larger than that in the case where the charge holding film includes only the first portion 1281, which makes it possible to decrease potential difference between the both edges of the electric line of force. More specifically, much part of the voltage applied to the gate electrode 1217 is used to reinforce electric fields in the offset region 1271.

Electric charges are injected into the silicon nitride film 1242 in rewrite operation because generated electric charges are pulled by electric fields in the offset region 1271. As a consequence, the silicon nitride film 1242 including the second portion 1282 increases the electric charges injected into the memory function body 1262 in rewrite operation, thereby increasing a rewrite speed.

In the case where the portion of the silicon oxide film 1243 is a silicon nitride film, more specifically, in the case where the charge holding film is not flat against the height corresponding to the surface of the gate insulating film 1214, movement of electric charges toward upper side of the silicon nitride film becomes outstanding, and holding characteristics are deteriorated.

Instead of silicon nitride film, the charge holding film is more preferably formed from high-dielectric substances such as hafnium oxide having extremely large dielectric constant.

Further, the memory function body more preferably includes an insulating film (a portion of the s1241 on the silicon oxide film on the offset region 1271) that separates the charge holding film approximately parallel to the surface of the gate insulating film from the channel region (or the well region). This insulating film may restrain dispersion of the electric charges stored in the charge holding film, thereby enabling further improvement of holding characteristics.

Also, the memory function body more preferably includes an insulating film (a portion of the silicon oxide film 1241 in contact with the gate electrode 1217) that separates the gate electrode from the charge holding film extending in the direction approximately parallel to the side face of the gate electrode. This insulating film may prevent injection of electric charges from the gate electrode into the charge holding film and prevent change of electric characteristics, which may increase reliability of the memory device.

Further, similar to the second embodiment, it is preferable that the film thickness of the insulating film under the silicon nitride film 1242 (a portion of the silicon oxide film 1241 on the offset region 1271) is controlled to be constant, and further the film thickness of the insulating film disposed on the side face of the gate electrode (a portion of the silicon oxide film 1241 in contact with the gate electrode 1217) is controlled to be constant. Consequently, the concentration of electric line of force generated by the electric charges stored in the silicon nitride film 1242 may be roughly controlled, and leakage of electric charges may be prevented.

(Fourth Embodiment)

In this embodiment, optimization of the distance between a gate electrode, a memory function body, and a source/drain region is explained.

Figure 14:
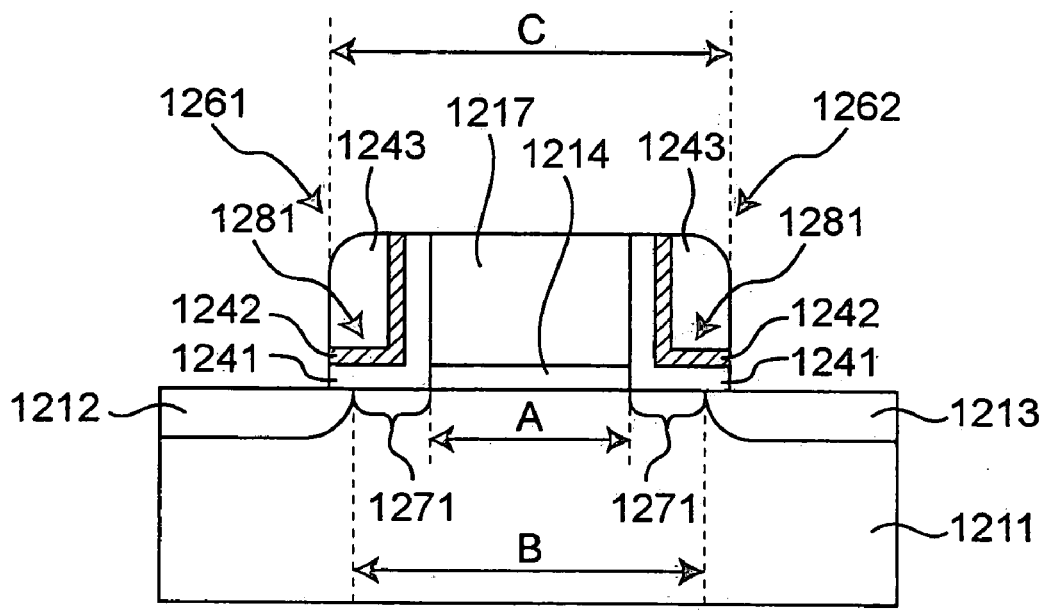
FIG. 14 is a schematic sectional view of the essential part of a memory element in the semiconductor storage device of the fourth embodiment of the present invention.

As shown in FIG. 14, reference symbol A denotes a gate electrode length in the cross section in channel length direction, reference symbol B denotes a distance (channel length) between source and drain regions, and reference symbol C denotes a distance from the edge of one memory function body to the edge of the other memory function body, more specifically a distance from the edge of a film (the side away from the gate electrode) having a function of holding the electric charges in one charge holding portion in the cross section in channel length direction to the edge of a film 1242 (the side away from the gate electrode 1217) having a function of holding the electric charges in the other memory function body 1262.

An equation A<B is preferable. When this equation is satisfied, in the channel region, there is present an offset region 1271 between a portion under the gate electrode 1217 and the source/drain regions 1212, 1213. Thereby, the electric charges stored in the memory function bodies 1261, 1262 (silicon nitride film 1242) effectively change easiness of inversion in the entire part of the offset region 1271. As a result, memory effect is increased, and high-speed read operation is particularly enabled.

Also, when the gate electrode 1217 and the source/drain regions 1212, 1213 are offset, that is when an equation A<B is satisfied, easiness of inversion of the offset region when a voltage is applied to the gate electrode 1217 is largely changed by an electric charge amount stored in the memory function bodies 1261, 1262. Consequently, memory effect increases and short channel effect can be reduced.

However, as long as the memory effect is effective, the offset region is not necessarily required. Even when the offset region 1271 is not present, if the impurity concentration in the source/drain regions 1212, 1213 is sufficiently small, the memory effect can still be effective in the memory function bodies 1261, 1262 (silicon nitride film 1242).

While, as described referring to FIG. 11, a memory function can not be obtained unless at least part of the silicon nitride film 1242a is overlapped with the source/drain region 1212, 1213. Consequently, the equation B<C is preferably satisfied. Therefore, the state of A<B<C is most preferable.

(Fifth Embodiment)

Figure 15:
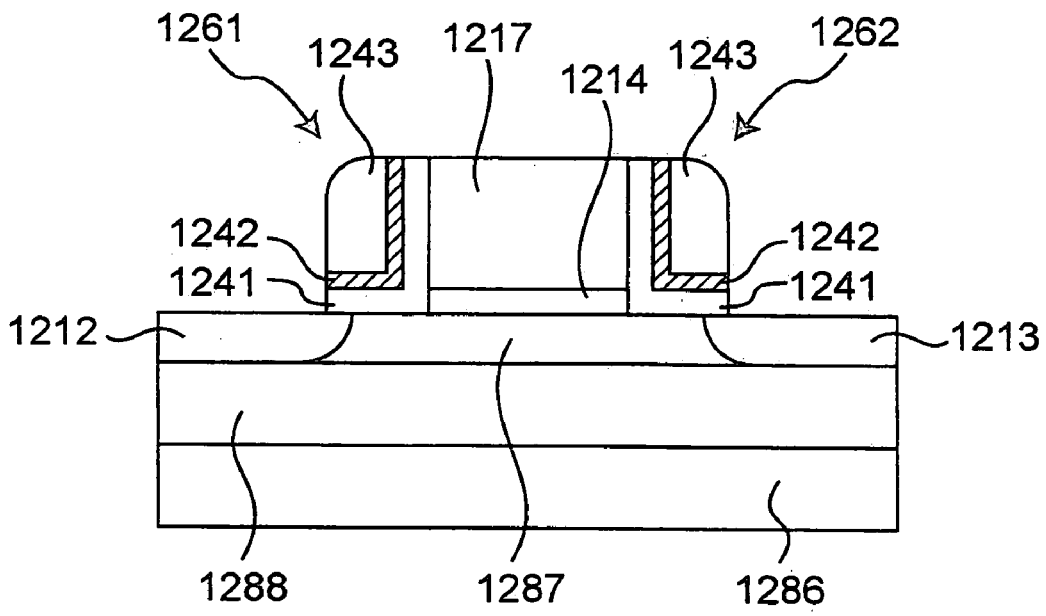
FIG. 15 is a schematic sectional view of the essential part of a memory element in the semiconductor storage device of the fifth embodiment of the present invention.

A memory device of semiconductor storage device according to this embodiment has essentially the same structure as that in the second embodiment except that the semiconductor substrate is SOI substrate as shown in FIG. 15.

The memory device is structured such that an embedded oxide film 1288 is formed on a semiconductor substrate 1286, and on top of the embedded oxide film 1288, SOI layer is further formed. In the SOI layer, there are formed diffusion regions 1212, 1213, and other areas constitute a body region 1287.

This memory device also brings about the functions and effects similar to those of the memory device in the second embodiment. Further, since the junction capacitance between the diffusion regions 1212, 1213 and the body region 1287 may be considerably reduced, it becomes possible to increase a device speed and to decrease power consumption.

(Sixth Embodiment)

Figure 16:
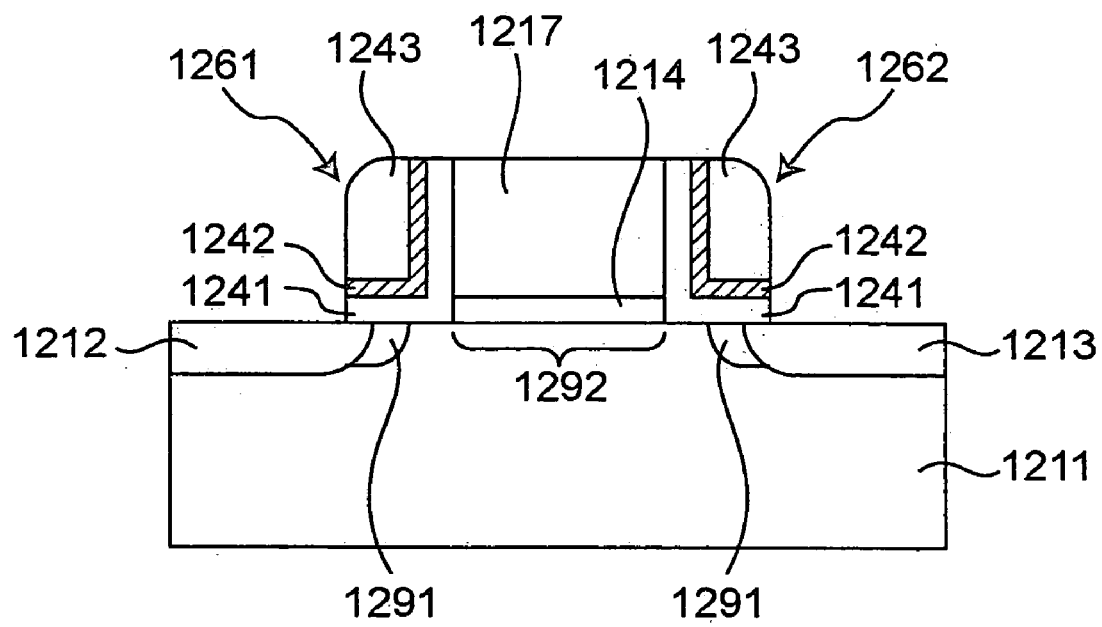
FIG. 16 is a schematic sectional view of the essential part of a memory element in the semiconductor storage device of the sixth embodiment of the present invention.

A memory device in this embodiment has essentially the same structure as that in the second embodiment except that in the vicinity of the channel side of N type diffusion regions 1212, 1213, a P type highly-concentrated region 1291 is added as shown in FIG. 16.

More specifically, the concentration of P type impurity (e.g., boron) in the P type highly-concentrated region 1291 is higher than the concentration of P type impurity in the region 1292. An appropriate value of the P type impurity concentration in the P type highly-concentrated region 1291 is, for example, around $5\times10^{17}$ to $1\times10^{19}$ cm$^{-3}$. Also, a value of the P type impurity concentration in the region 1292 may be set to, for example, $5\times10^{16}$ to $1\times10^{18}$ cm$^{-3}$.

Thus, providing the P type highly-concentrated region 1291 makes the junction between the diffusion regions 1212, 1213 and the semiconductor substrate 1211 steep right under the memory function bodies 1261, 1262. This facilitates generation of hot carriers in write and erase operation, thereby enabling reduction of voltage in write operation and erase operation or implementing high-speed write operation and erase operation. Further, since the impurity concentration in the region 1292 is relatively small, a threshold value when the memory is in erased state is small and so the drain current becomes large. Consequently, a read speed is increased. This makes it possible to provide a memory device having low rewrite voltage or a high rewrite speed, and having a high read speed.

Also in FIG. 16, by providing the P type highly-concentrated region 1291 in a position adjacent to the source/drain region and on the lower side of the memory function bodies 1261, 1262 (that is a position not right under the gate electrode), a threshold value of the entire transistor shows considerable increase. The degree of this increase is extremely larger than that in the case where the P type highly-concentrated region 1291 is right under the gate electrode. When write electric charges (electrons in the case where the transistor is N channel type) are stored in the memory function bodies 1261, 1262, the difference becomes larger. When enough erase electric charges (positive holes in the case where the transistor is N channel type) are stored in the memory function body, a threshold value of the entire transistor is decreased down to a value determined by the impurity concentration in the channel region (region 1292) under the gate electrode 1217. More specifically, the threshold value in the erased state is not dependent on the impurity concentration in the P type highly-concentrated region 1291, whereas the threshold value in the written state receives extremely large influence. Therefore, disposing the P type highly-concentrated region 1291 under the memory function bodies and adjacent to the source/drain region imparts extremely large fluctuation only to the threshold value in the written state, thereby enabling remarkable increase of memory effect (difference of threshold values in the erased state and the written state).

(Seventh Embodiment)

Figure 17:
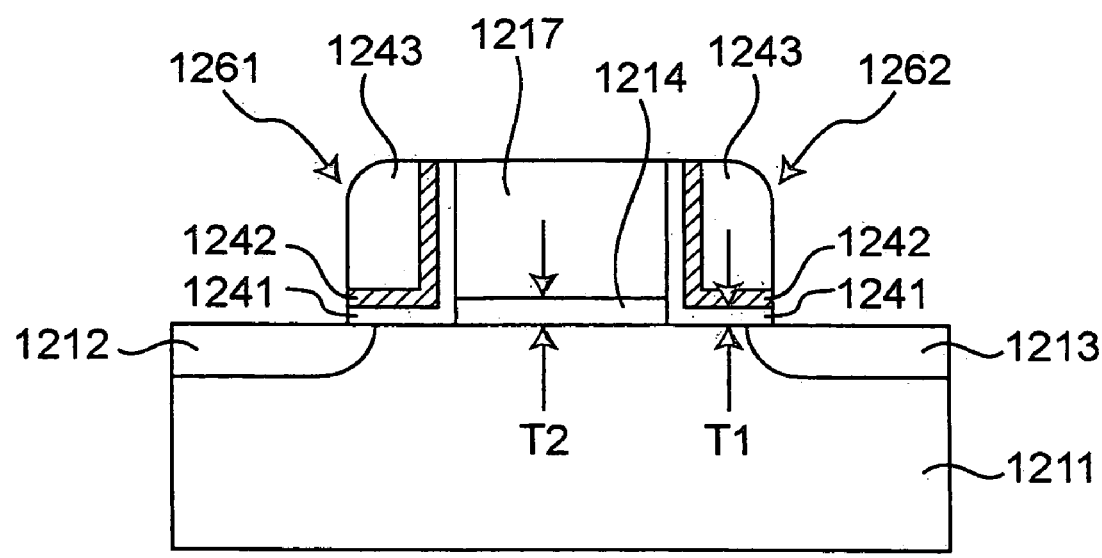
FIG. 17 is a schematic sectional view of the essential part of a memory element in the semiconductor storage device of the seventh embodiment of the present invention.

A memory body of a semiconductor storage device in this embodiment has essentially the same structure as that in the second embodiment except that the thickness T1 of the insulating film 1241 that separates the charge holding film (silicon nitride film 1242) from the channel region or the well region 1211 is smaller than the thickness T2 of the gate insulating film 1214 as shown in FIG. 17.

The gate insulating film 1214 has a lower limit of the thickness T2 because of the request for withstand voltage in memory rewrite operation. However, the thickness T1 of the insulating film 1241 can be smaller than T2 regardless of the request for withstand voltage.

In the memory device of the present embodiment, the thickness T1 of the insulating film has high design freedom as stated above because of the following reason.

In the memory device, the insulating film 1241 that separates the charge holding film (silicon nitride 1242) from the channel region or the well region is not interposed in between the gate electrode 1217 and the channel region or the well region. Consequently, the insulating film 1241 that separates the charge holding film (silicon nitride 1242) from the channel region or the well region does not receive direct influence from the high-electric fields that affect in between the gate electrode 1217 and the channel region or the well region, but receives influence from relatively weak electric fields expanding from the gate electrode 1217 in lateral direction. As a result, despite the request for withstand voltage to the gate insulating film 1214, it becomes possible to make T1 smaller than T2. Decreasing the thickness T1 of the insulating film facilitates injection of electric charges into the memory function bodies 1261, 1262, decreases voltage for write operation and erase operation, or enables high-speed write operation and erase operation. In addition, since an electric charge amount induced in the channel region or the well region increases when electric charges are stored in the silicon nitride film 1242, increased memory effect may be implemented.

Some electric lines of force having short length in the memory function body do not pass the silicon nitride film 1242 as shown with an arrow 1284 in FIG. 13. Since electric field strength is relatively large on such a short electric line of force, the electric fields along the electric line of force plays an important role in rewrite operation. By decreasing the thickness T1 of the insulating film 1241, the silicon nitride film 1242 moves to the lower side of the FIG. 13, so that the electric line of force shown with the arrow 1284 passes the silicon nitride film 1242. As a consequence, an effective dielectric constant in the memory function body along the electric line of force 1284 in the direction of arrow 1284 becomes large, which makes it possible to make potential difference between the both ends of the electric line of force 1284 smaller. Therefore, most part of voltage applied to the gate electrode 1217 is used to strengthen the electric fields in the offset region, thereby implementing high-speed write operation and erase operation.

Contrary to this, for example in EEPROM as typified by flash memory, an insulating film that separates a floating gate from the channel region or the well region is interposed in between a gate electrode (control gate) and the channel region or the well region, so that the insulating film receives direct influence from high electric fields of the gate electrode. In EEPROM, therefore, the thickness of the insulating film that separates the floating gate from the channel region or the well region is limited, which hinders optimization of the functions of a memory device.

As is clear from the above, by setting the thickness T1 of the insulating film 1241 and the thickness T2 of the gate insulating film 1214 as T1<T2, it becomes possible to decrease voltage in write operation and erase operation or implement high-speed write operation and erase operation, and to enable further increase of memory effect without degrading withstand voltage capability of the memory. It is noted that the thickness T1 of the insulating film is preferably 0.8 nm or more, that is the limit range in which uniformity in manufacturing process or certain level of film quality may be maintained and holding characteristics do not suffer extreme deterioration.

More specifically, in the case of liquid crystal driver LSI which has a severe design rule and requires high withstand voltage, maximum 15 to 18V voltage is necessary for driving liquid crystal panel TFT (Thin Film Transistor). Eventually, it is not possible to make the gate oxide film thinner. In the case of mounting a nonvolatile memory of the present invention as an image adjuster together with other devices on the liquid crystal driver LSI, the memory device of the present invention enables optimum design of the thickness of the insulating film that separates the charge holding film (silicon nitride film 1242) from the channel region or the well region independently of the thickness of the gate insulating film. For example, in a memory cell with a gate electrode length (word line width) of 250 nm, there may be separately set like T1=20 nm and T2=10 nm, fulfilling a memory cell with good write efficiency. (Short channel effect is not generated even though T1 is larger than that of normal logic transistors, because the source/drain region is offset from the gate electrode.)

(Eighth Embodiment)

Figure 18:
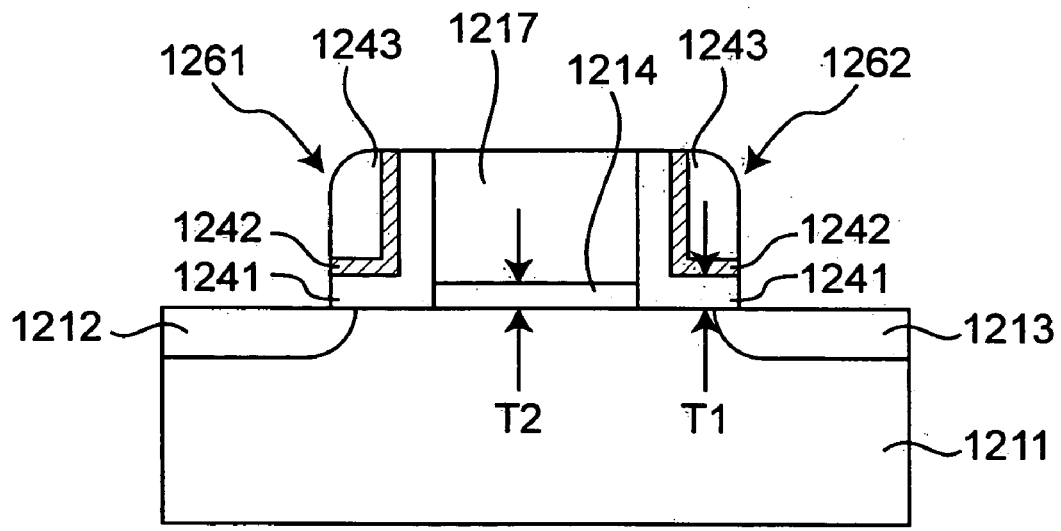
FIG. 18 is a schematic sectional view of the essential part of a memory element in the semiconductor storage device of the eighth embodiment of the present invention.

A memory device of a semiconductor storage device according to this embodiment has essentially the same structure as that in the second embodiment except that the thickness (T1) of the insulating film that separates the charge holding film (silicon nitride film 1242) from the channel region or the well region is larger than the thickness (T2) of the gate insulating film as shown in FIG. 18.

The gate insulating film 1214 has an upper limit of the thickness T2 because of the request for prevention of short channel effect of the device. However, the thickness T1 of the insulating film 1241 can be larger than T2 regardless of the request for prevention of short channel effect. More specifically, as miniaturization scaling proceeds (thinning of the gate insulating film proceeds), the thickness of the insulating film that separates the charge holding film (silicon nitride film 1242) from the channel region or the well region may be optimally designed independently of the thickness T2 of the gate insulating film, which implements the effect that the memory function body will not disturb scaling.

In the memory device of the present embodiment, the thickness T1 of the insulating film has high design freedom as stated above because, as is already described, the insulating film that separates the charge holding film from the channel region or the well region is not interposed in between the gate electrode and the channel region or the well region. As a result, despite the request for prevention of short channel effect to the gate insulating film, it becomes possible to make T1 larger than T2.

Increasing the thickness of the insulating film makes it possible to prevent dispersion of the electric charges stored in the memory function body and to improve holing characteristics of the memory.

Therefore, setting as T1>T2 enables improvement of holding characteristics without deteriorating short channel effect of the memory.

It is noted that the thickness T1 of the insulating film is preferably 20 nm or less in consideration of reduction of a rewrite speed.

More specifically, a conventional nonvolatile memory as typified by flash memory is structured such that a selection gate electrode constitutes a write/erase gate electrode, and a gate insulating film (including a floating gate) corresponding to the write/erase gate electrode serves also as an electric charge storage film. Consequently, since the request for miniaturization (creation of thinner devices is essential for restraining short channel effect) conflicts the request for securing reliability (in order to control leakage of stored electric charges, the thickness of an insulating film that separates a floating gate from the channel region or the well region cannot be decreased to smaller than approx. 7 nm), miniaturization of the device is difficult. In fact, according to ITRS (International Technology Roadmap for Semiconductors), miniaturization of a physical gate length down to approx. 0.2 micron or lower is not yet in sight. In the memory device of the present invention, independent designing of T1 and T2 is available as described above, and therefore miniaturization becomes possible.

In the present invention, for example, in a memory cell with a gate electrode length (word line width) of 450 nm, there is separately set like T2=4 nm and T1=7 nm, fulfilling a semiconductor storage device free from generation of short channel effect. Short channel effect is not generated even though T2 is set larger than that of normal logic transistors, because the source/drain region is offset from the gate electrode.

Also, since the source/drain region is offset from the gate electrode in the memory device of the present invention, miniaturization is further facilitated compared to normal logic transistors.

As described above, since an electrode for supporting write and erase operation is not present above the memory function body, the insulating film that separates the charge holding film from the channel region or the well region does not directly receive the influence of high electric fields that affect in between the electrode that supports write and erase operation and the channel region or the well region, but receives influence only from relatively weak electric fields expanding from the gate electrode in lateral direction. This makes it possible to fulfill a memory cell having the gate length miniaturized more than the gate length of the logic transistors in comparison with the same processing accuracy.

(Ninth Embodiment)

This embodiment relates to changes of electric characteristics when rewrite operation is performed in the memory device of the semiconductor storage device according to the present invention.

Figure 19:
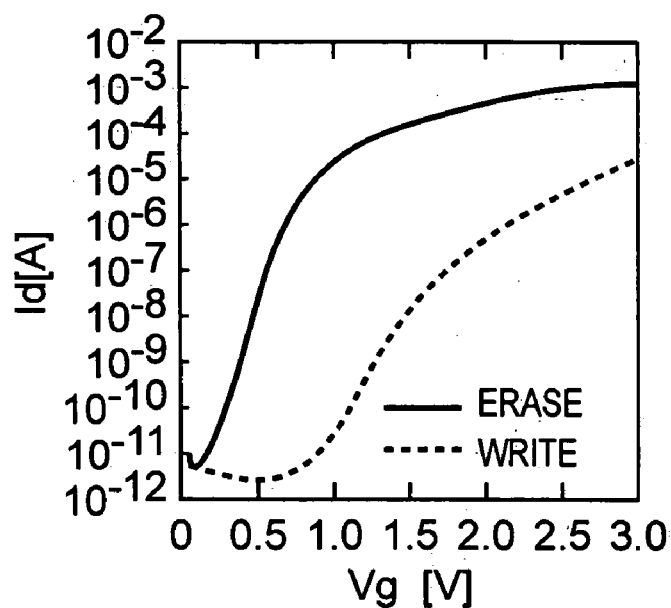
FIG. 19 is a graph showing the electrical characteristic of the memory element in the semiconductor storage device of the ninth embodiment.

FIG. 19 is a view showing characteristic curves of a drain current (Id) versus a gate voltage (Vg) (measured values) where an electric charge amount in the memory function body of an N-channel type memory device varies between erase state and written state.

Figure 29:
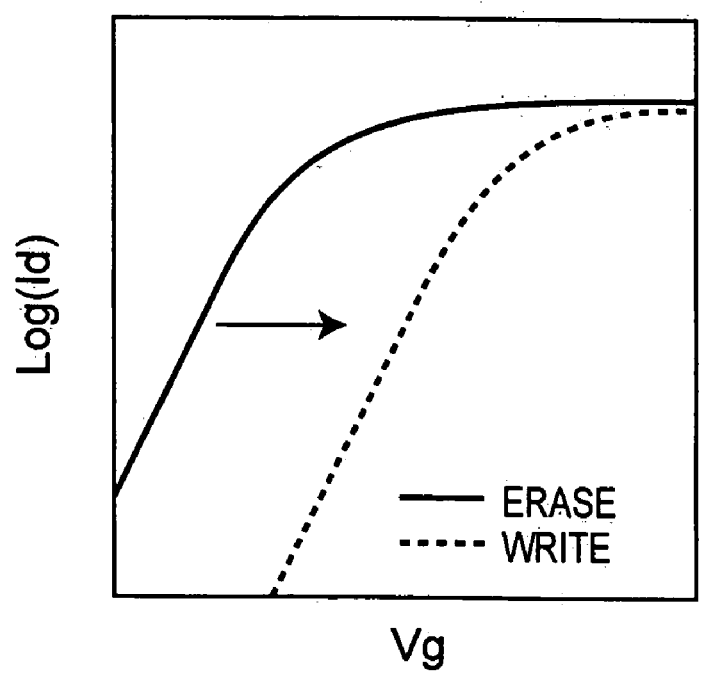
FIG. 29 is a graph showing the electrical characteristic of the conventional flash memory.

As clearly shown in FIG. 19, when write operation is performed in the erased state (a solid line), as shown by a broken line, not only the threshold value simply rises, but inclination of the graph dramatically falls especially in sub-threshold region. Therefore, even in the region with relatively high gate voltage (Vg), a drain current ratio of the erased state to the written state is large. For example in the point of Vg=2.5V, the current ratio is still two digits or more. This characteristic is largely different from that in the case of a flash memory shown in FIG. 29.

The appearance of the above characteristic in the memory device is a phenomenon peculiar to the case where the gate electrode and the diffusion region are offset and therefore the gate electric fields are difficult to reach the offset region. When the memory device is in the written state, an inversion layer is extremely difficult to be generated in the offset region below the memory function body even if a positive voltage is applied to the gate electrode. This causes smaller inclination of the Id-Vg curve line in the sub-threshold region in the written state.

When the memory device is in the erased state, high-density electrons are induced in the offset region. Further, when 0V is applied to the gate electrode (i.e., in OFF state), electrons are not induced in the channel below the gate electrode (and therefore an off current is small). This causes large differential coefficient of the Id-Vg curve line in the sub-threshold region in the erased state and a large increase rate of current (conductance) even in the voltage region over the threshold.

As is clear from the above description, the memory device of the semiconductor storage device according to the present invention makes it possible to make the drain current ratio of the erased state to the written state particularly large.

(Tenth Embodiment)

In this tenth embodiment, a semiconductor storage device provided with a memory cell array in which the memory elements of the first through eighth embodiments are employed as memory cells will be described.

Figure 20:
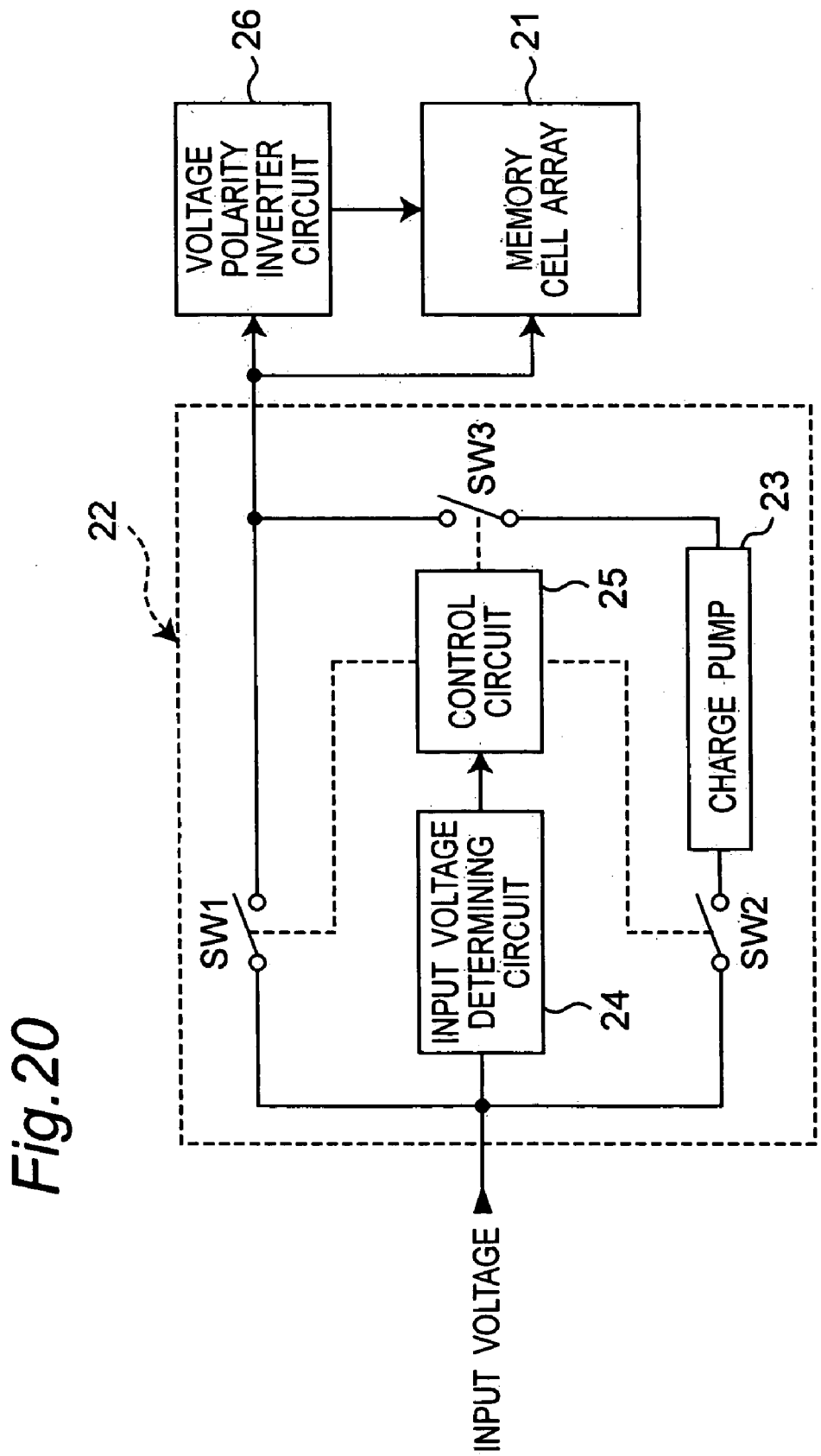
FIG. 20 is a block diagram of the semiconductor storage device of the tenth embodiment of the present invention.

FIG. 20 shows a block diagram of the semiconductor storage device of the tenth embodiment of the present invention provided with a memory cell array in which the memory elements shown in FIG. 1 are employed as memory cells. As shown in FIG. 20, this semiconductor storage device is provided with a memory cell array 21, a positive polarity power selector circuit 22 and a voltage polarity inverter circuit 26.

The positive polarity power selector circuit 22 is provided with a first switch SW1 that has an input terminal to which an input voltage (positive voltage) supplied from the outside to a memory cell array 21 is applied and has an output terminal connected to the input terminal of the memory cell array 21, a second switch SW2 that has an input terminal to which the input voltage is applied, a charge pump 23 that has a pump input terminal connected to an output terminal of the second switch SW2, a third switch SW3 that has an input terminal connected to a pump output terminal of the charge pump 23 and has an output terminal connected to the input terminal of the memory cell array 21, an input voltage determining circuit 24 that determines whether or not the input voltage is not higher than a prescribed voltage, and a control circuit 25 that controls the turning-on-and-off of the first, second and third switches SW1, SW2 and SW3. The prescribed voltage is assumed to be, for example, an operating voltage that guarantees the operation of the memory cell array 21.

When the input voltage determining circuit 24 determines that the input voltage exceeds the prescribed voltage, the control circuit 25 turns on the first switch SW1 and turns off the second and third switches SW2 and SW3, thereby supplying the input voltage from the outside to the memory cell array 21 via the first switch SW1.

When the input voltage determining circuit 24 determines that the input voltage is not higher than the prescribed voltage, the control circuit 25 turns off the first switch SW1 and turns on the second and third switches SW2 and SW3, thereby supplying a voltage whose voltage level is accurate from the charge pump 23 to the memory cell array 21.

In the tenth embodiment, there is supposed the case where a current sufficient for erase is supplied when a negative voltage is applied to the gate electrode during erase even if a voltage is not supplied from the outside. That is, this tenth embodiment employs a voltage polarity inverter circuit 26 to generate the negative voltage. The voltage polarity inverter circuit 26, of which the input terminal is connected to the output terminal of the first switch SW1, inverts the polarity of the voltage inputted to the input terminal and outputs the resulting voltage to the memory cell array 21. This voltage polarity inverter circuit 26 inverts only the polarity of the voltage without changing the absolute value of the voltage.

For example, when voltages of 6 V and GND are applied to the source and drain electrodes, respectively, during erase, a voltage of −6 V is applied to the gate electrode. In FIG. 5, the gate voltage during erase is set to −5 V. However, when a voltage of −6 V is applied to the gate electrode, both the voltage across the gate and the drain and the voltage across the gate and the source are increased than when the voltage of −5 V is applied, and therefore, the erase operation is reliably executed.

The tenth embodiment employs the voltage polarity inverter circuit that inverts only the polarity of the voltage without changing the absolute value of the voltage in order to simplify the circuit. However, the present invention is not limited to this, and the absolute value of the voltage subjected to the polarity inverter may be changed.

Figure 21:
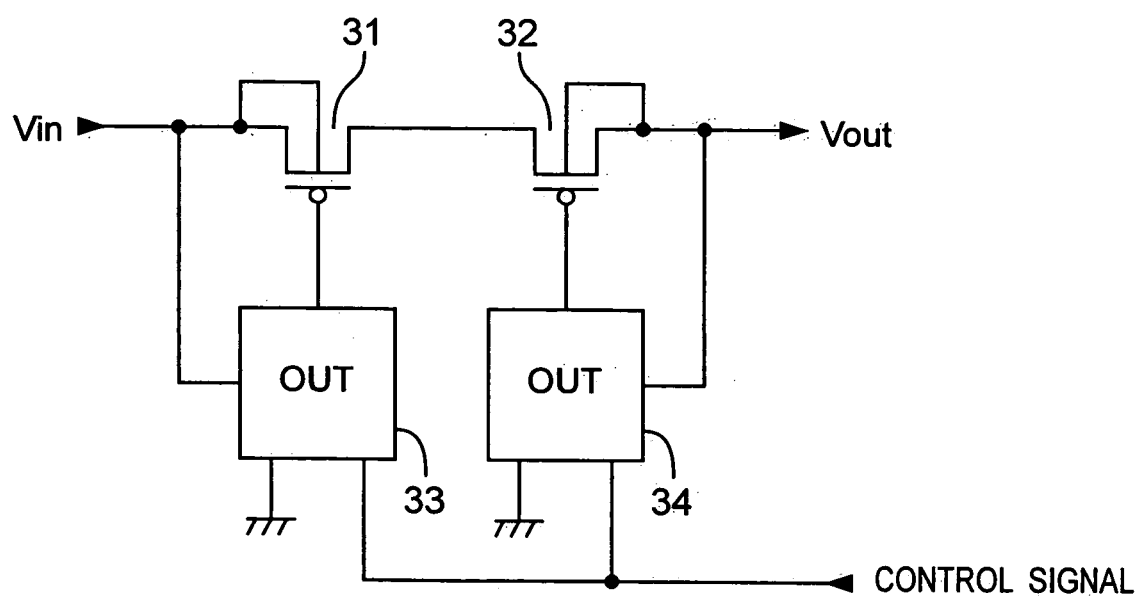
FIG. 21 is a circuit diagram of the first, second and third switches employed in the above semiconductor storage device.

FIG. 21 shows a switch circuit as one example of the first, second and third switches SW1, SW2 and SW3.

As shown in FIG. 21, this switch circuit has a first P-channel field-effect transistor 31 to the source of which an input voltage Vin is applied, a second P-channel field-effect transistor 32 of which the drain is connected to the drain of the first P-channel field-effect transistor 31 and the source of which forms an output terminal, a first voltage level shifter 33 that connects the gate of the first P-channel field-effect transistor 31 selectively to either one of the source and the ground according to a control signal, and a second voltage level shifter 34 that connects the gate of the second P-channel field-effect transistor 32 selectively to either one of the source and the ground according to a control signal.

When turning on this switch circuit, the gate of the first P-channel field-effect transistor 31 is connected to the ground by the first voltage level shifter 33, and the gate of the second P-channel field-effect transistor 32 is connected to the ground by the second voltage level shifter 34. When turning off this switch circuit, the gate of the first P-channel field-effect transistor 31 is connected to the source (input terminal) by the first voltage level shifter 33, and the gate of the second P-channel field-effect transistor 32 is connected to the source (output terminal) by the second voltage level shifter 34.

This tenth embodiment is not necessarily limited to the use of the switch circuit shown in FIG. 21, and a switch circuit of another construction may be employed.

Figure 22:
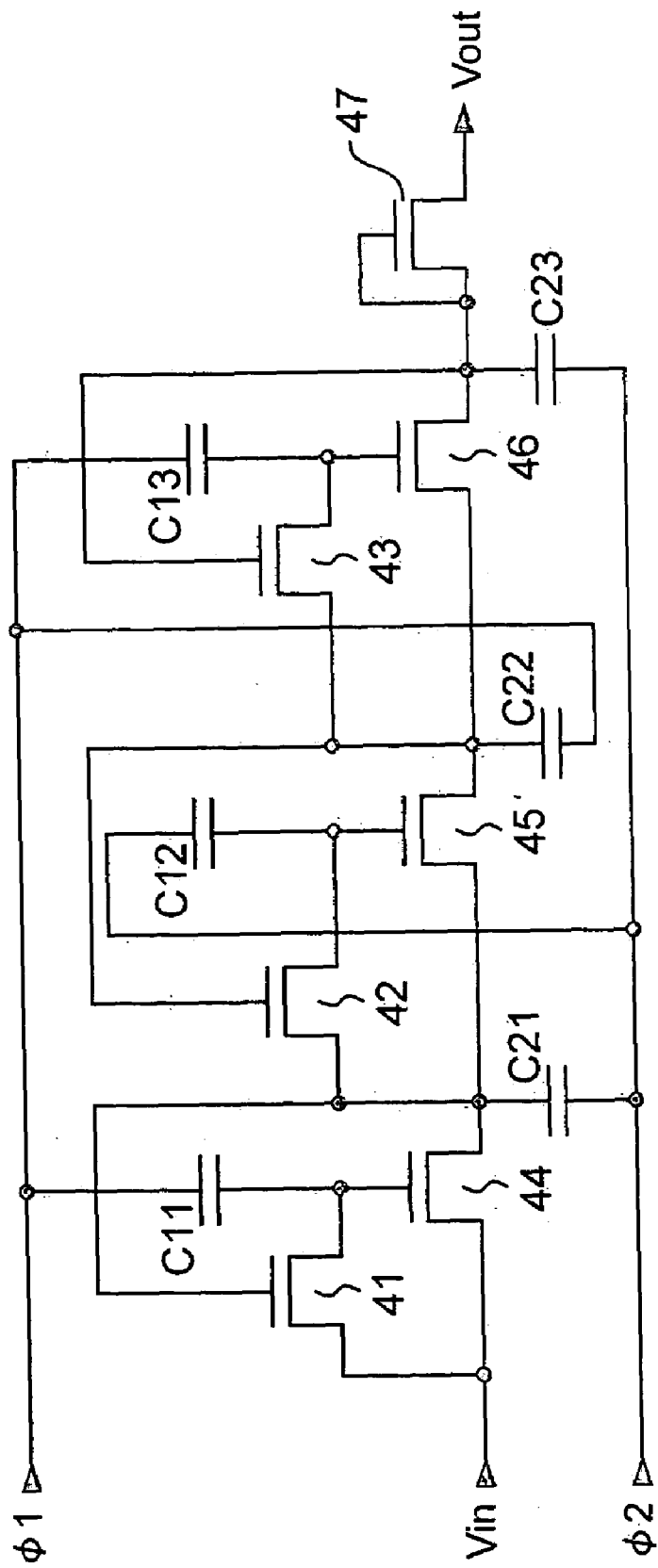
FIG. 22 is a circuit diagram of the charge pump employed in the above semiconductor storage device.

FIG. 22 shows one example of the charge pump 23 shown in FIG. 20. As shown in FIG. 22, this charge pump is provided with a transistor 41 that has one terminal to which the input voltage Vin is applied, a transistor 42 that has one terminal connected to the gate of the transistor 41, a transistor 43 that has one terminal connected to the gate of the transistor 42, a transistor 44 that has a gate connected to the other terminal of the transistor 41 and one terminal to which the input voltage Vin is applied, a transistor 45 that has one terminal connected to the other terminal of the transistor 44 and a gate connected to the other terminal of the transistor 42, a transistor 46 that has one terminal connected to the other terminal of the transistor 45 and a gate connected to the other terminal of the transistor 43, a transistor 47 that has one terminal connected to the other terminal of the transistor 46 and a gate connected to the one terminal, a capacitor C11 that has one terminal connected to the gate of the transistor 44 and the other terminal to which a clock signal φ1 is applied, a capacitor C12 that has one terminal connected to the gate of the transistor 45 and the other terminal to which a clock signal φ2 is applied, a capacitor C13 that has one terminal connected to the gate of the transistor 46 and the other terminal to which the clock signal φ1 is applied, a capacitor C21 that has one terminal connected to the other terminal of the transistor 44 and the other terminal to which a clock signal φ2 is applied, a capacitor C22 that has one terminal connected to the other terminal of the transistor 45 and the other terminal to which the clock signal φ1 is applied, and a capacitor C23 that has one terminal connected to the other terminal of the transistor 46 and the other terminal to which the clock signal φ2 is applied. One terminal of the transistor 42 is connected to the other terminal of the transistor 44. Moreover, one terminal of the transistor 43 is connected to the other terminal of the transistor 45, while the gate of the transistor 43 is connected to the other terminal of the transistor 46. An output voltage Vout is outputted from the other terminal of the transistor 47.

The charge pump of the aforementioned construction operates the transistors 41 through 46 by the clock signals φ1 and φ2 of two different phases, thereby successively accumulating large electric charges in the capacitors C21, C22 and C23 and outputting a boosted output voltage Vout from the other terminal of the transistor 47.

This tenth embodiment is not necessarily limited to the use of the charge pump shown in FIG. 22, and a charge pump of another circuit construction may be employed.

Figure 23:
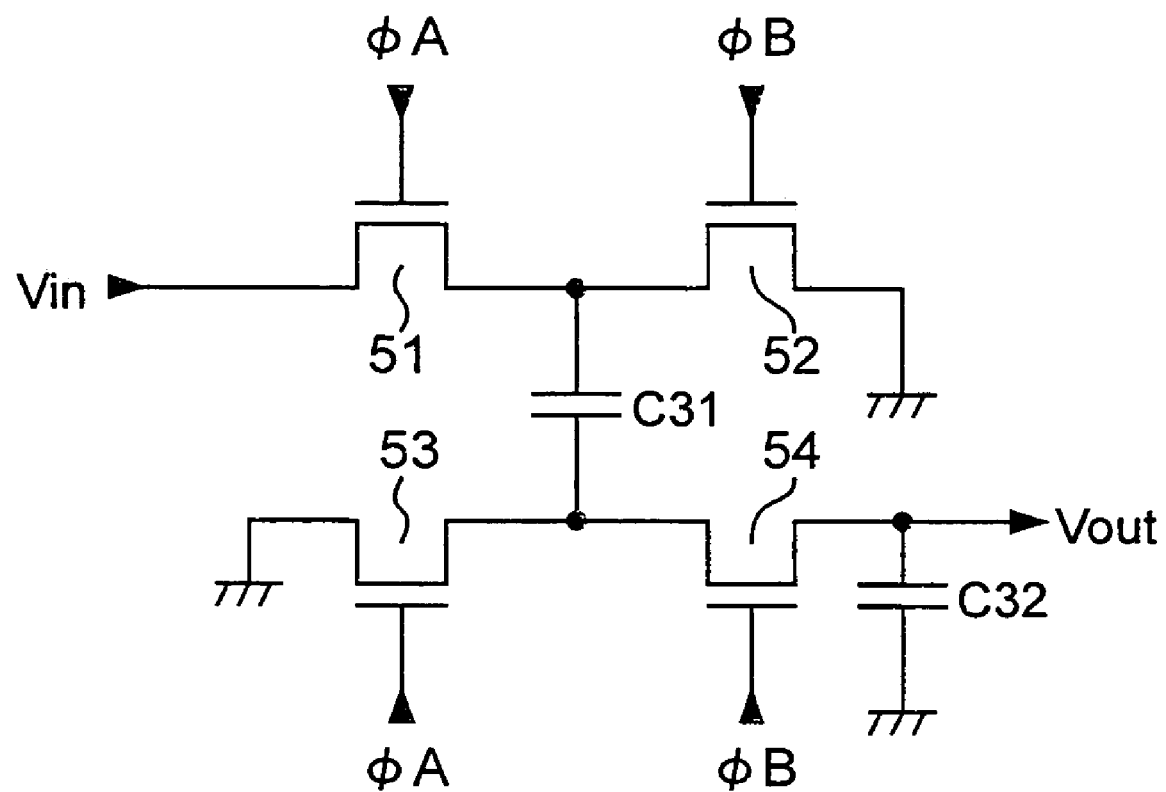
FIG. 23 is a circuit diagram of the voltage polarity inverter circuit employed in the above semiconductor storage device.

FIG. 23 shows one example of the voltage polarity inverter circuit 26 shown in FIG. 20. As shown in FIG. 23, this voltage polarity inverter circuit is provided with a switch 51 that has one terminal to which the input voltage Vin is applied, a switch 52 that has one terminal connected to the other terminal of the switch 51 and the other terminal connected to the ground, a switch 53 that has one terminal connected to the ground, a switch 54 that has one terminal connected to the other terminal of the switch 53, a capacitor C31 that connects the connection point of the switches 51 and 52 to the connection point of the switches 53 and 54, and a capacitor C32 connected across the other terminal of the switch 54 and the ground. The output voltage Vout is outputted from the other terminal of the switch 54.

The switches 51 and 53 are operated so as to be turned on and off by a clock signal φA, while the switches 52 and 54 are operated so as to be turned on and off by a clock signal φB (having a phase inverted with respect to the clock signal φA). By the above-mentioned operation, the capacitor C31 is charged with electric charges when the clock signal φA has high level. If the clock signal φB goes high level when the clock signal φA has low level, then the electric charges accumulated in the capacitor C31 partially move to the capacitor C32 according to the law of electric charge redistribution. By the electric charge redistribution repeated by the clock signals φA and φB, the output voltage Vout, of which the absolute value is equal to that of the input voltage Vin and the polarity is opposite, is obtained across both terminals of the capacitor C32.

This tenth embodiment is not necessarily limited to the use of the voltage polarity inverter circuit shown in FIG. 22, and a switch circuit of another construction may be employed.

Figure 24:
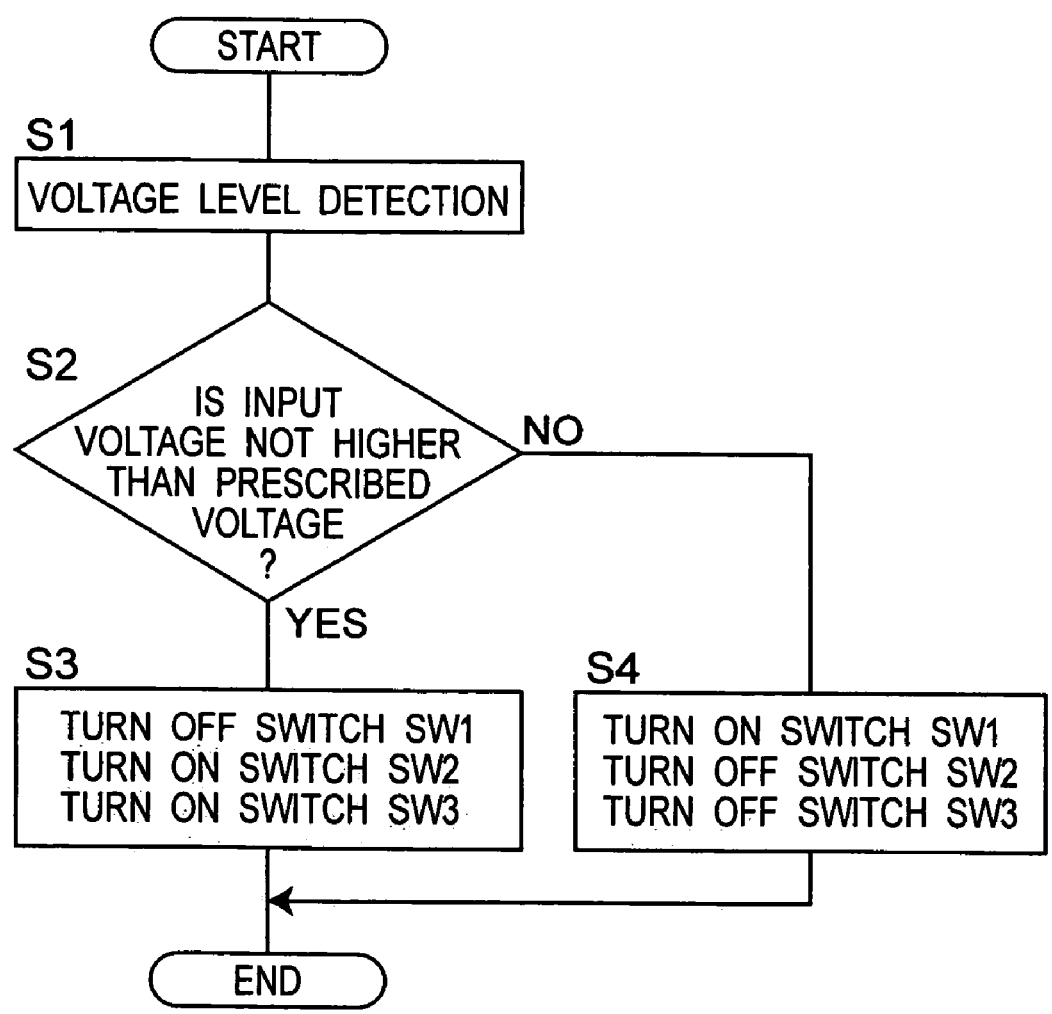
FIG. 24 is a flow chart for explaining the operation of the control circuit of the above semiconductor storage device.

FIG. 24 is a flow chart for explaining the operation of the semiconductor storage device of the tenth embodiment, showing a procedure for operating the control circuit 25 shown in FIG. 20.

First of all, the voltage level of the input voltage is detected by the input voltage determining circuit 24 in step S1, and it is determined in step S2 whether or not the detected input voltage is not higher than the prescribed voltage. If the input voltage is not higher than the prescribed voltage in step S2, then the program flow proceeds to step S3 to turn off the switch SW1 and turn on the switches SW2 and SW3, ending this processing.

If it is determined that the input voltage exceeds the prescribed voltage in step S2, then the program flow proceeds to step S4 to turn on the switch SW1 and turn off the switches SW2 and SW3, ending this processing.

As described above, the aforementioned semiconductor storage device can retain the 2-bit storage by employing the memory element shown in FIG. 1 for the memory cell array as a memory cell even if miniaturized, and the circuit malfunction attributed to the small current supplied to the memory cell array can be prevented by the positive polarity power selector circuit 22 shown in FIG. 20.

Moreover, by employing the switch circuit of the construction shown in FIG. 21 for the first, second and third switches SW1, SW2 and SW3, the device can be provided with a small circuit area, and the positive polarity power selector circuit 22 is accurately operated.

Moreover, by setting the prescribed voltage to a voltage within a range of +3 V to +12 V, an appropriate voltage and a sufficient current can be supplied to the memory element as the memory cell that constitutes the memory cell array 21.

Furthermore, by converting the positive voltage into the negative voltage by the voltage polarity inverter circuit 26 when the negative voltage is supplied to the gate electrode during the erase operation of the memory element as the memory cell, applying the positive voltage to the drain electrode and applying the negative voltage to the gate electrode, efficient reliable erase operation can be achieved with a small circuit area.

(Eleventh Embodiment)

Figure 25:
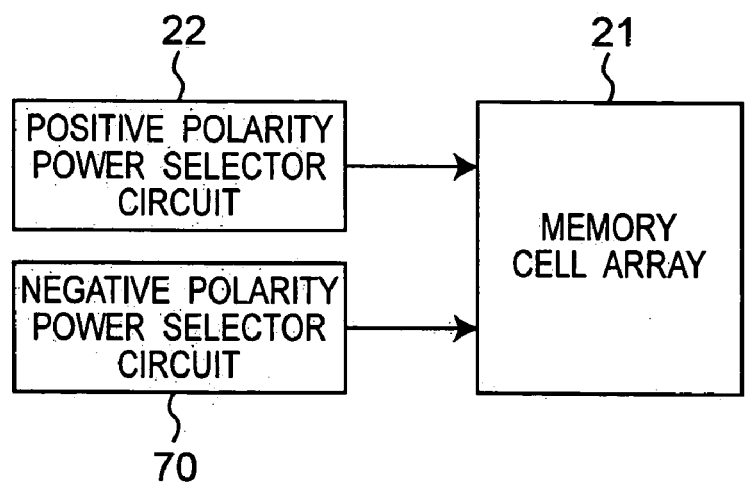
FIG. 25 is a block diagram of the semiconductor storage device of the eleventh embodiment of the present invention.

FIG. 25 shows a block diagram of the semiconductor storage device of the eleventh embodiment of the present invention. In the aforementioned tenth embodiment, there is supposed the case where a current sufficient for erase is supplied even if a voltage is not supplied from the outside when the negative voltage is applied to the gate electrode of the memory element that constitute the memory cell during erase. However, in this eleventh embodiment, there is supposed the case where a sufficient current cannot be obtained from the voltage polarity inverter circuit 26 shown in FIG. 20.

This eleventh embodiment is provided with a memory cell array 21 and a positive polarity power selector circuit 22 of the same constructions as those of the semiconductor storage device of the tenth embodiment shown in FIG. 20 and provided with a negative polarity power selector circuit 70 for a negative voltage in place of the voltage polarity inverter circuit 26.

The negative polarity power selector circuit 70 has a construction similar to that of the positive polarity power selector circuit 22 and is constructed of fourth through sixth switches that employ N-channel field-effect transistors in place of the first through third switches SW1 through SW3 that employ the P-channel field-effect transistors shown in FIG. 21. That is, the negative polarity power selector circuit 70 is provided with the fourth switch that has an input terminal to which an input voltage (negative voltage) supplied from the outside is applied and has an output terminal connected to the input terminal of the memory cell array, the fifth switch that has an input terminal to which the input voltage (negative voltage) is applied, a second charge pump that has a pump input terminal connected to an output terminal of the fifth switch, the sixth switch that has an input terminal connected to an output terminal of the second charge pump and has an output terminal connected to the input terminal of the memory cell array, a second input voltage determining circuit that determines whether or not the input voltage (negative voltage) is not lower than a second prescribed voltage, and a second control circuit that controls the turning-on-and-off of the fourth, fifth and sixth switches.

If the second input voltage determining circuit determines that the input voltage (negative voltage) is not higher than the second prescribed voltage (absolute value of the voltage is large) in the negative polarity power selector circuit 70, then the fourth switch is turned on, and the fifth and sixth switches are turned off to supply an external voltage to the memory cell array 21. If the second input voltage determining circuit determines that the input voltage (negative voltage) exceeds the second prescribed voltage (absolute value of the voltage is small), then the fourth switch is turned off, and the fifth and sixth switches are turned on to supply an accurate negative voltage to the memory cell array 21 from the second charge pump.

In the semiconductor storage device of this eleventh embodiment, the charge pump 23 serves as a first charge pump, the input voltage determining circuit 24 serves as a first input voltage determining circuit, and the control circuit 25 serves as a first control circuit, and the prescribed voltage used when the input voltage determining circuit 24 makes the determination of the input voltage (positive voltage) serves as a first prescribed voltage in the positive polarity power selector circuit 22.

Therefore, effects similar to those of the semiconductor storage device of the tenth embodiment are possessed, and a sufficient current can be supplied when the positive voltage and the negative voltage are supplied to the memory cell array 21.

Moreover, by employing the switch circuit of the construction shown in FIG. 21 for the first through sixth switches, the device can be provided with a small circuit area, and the positive polarity power selector circuit 22 and the negative polarity power selector circuit 70 are accurately operated.

Moreover, by setting the first prescribed voltage of the positive polarity power selector circuit 22 to a voltage within the range of +3 V to +12 V and setting the second prescribed voltage of the negative polarity power selector circuit 70 to a voltage within the range of −3 V to −12 V, an appropriate voltage and a sufficient current can be supplied to the memory element as the memory cell that constitutes the memory cell array 21.

(Twelfth Embodiment)

Figure 26:
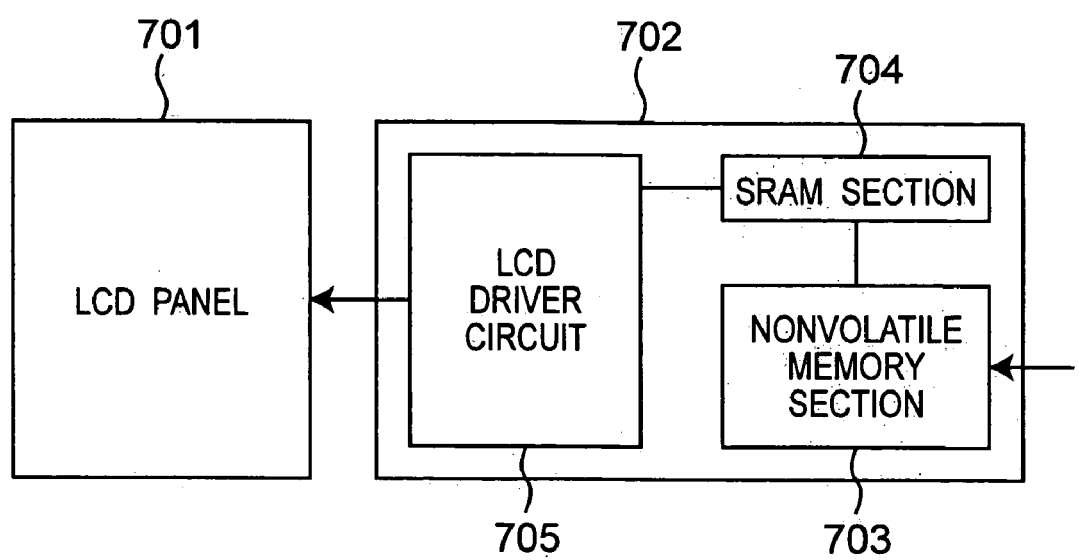
FIG. 26 is a schematic structural view of a liquid crystal display into which the semiconductor storage device of the twelfth embodiment of the present invention is integrated.

As an application example of the aforementioned semiconductor storage device, there can be enumerated, for example, a rewritable nonvolatile memory for the image adjustment of an LCD panel as shown in FIG. 26.

The LCD panel 701 shown in FIG. 26 is driven by an LCD driver 702. Inside the LCD driver 702, there exist a nonvolatile memory section 703 as a semiconductor storage device, an SRAM section 704 and an LCD driver circuit 705. The nonvolatile memory section 703 includes the nonvolatile memory element of the present invention preferably constructed of the semiconductor storage device of the tenth or eleventh embodiment. The nonvolatile memory section 703 has an externally rewritable construction.

The information stored in the nonvolatile memory section 703 is transferred to the SRAM section 704 when the power supply of the equipment is turned on. The LCD driver circuit 705 can read the storage information from the SRAM section 704 at need. By providing the SRAM section, the storage information can be read with very high speed.

The LCD driver 702 may either be externally attached to the LCD panel 701 as shown in FIG. 26 or formed on the LCD panel 701.

The LCD panel changes the gradation displayed by giving multi-step voltages to the pixels, where the relation between the given voltage and the displayed gradation has a variation depending on each product. Therefore, by storing information for correcting the variations of individual products after the completion of each product and executing correction based on the information, the image qualities of products can be uniformed. Therefore, it is preferable to mount the rewritable nonvolatile memory for storing the correction information on the LCD driver. It is preferable to employ the nonvolatile memory element of the present invention as this nonvolatile memory and particularly preferable to employ the semiconductor storage device described in connection with the tenth or eleventh embodiments in which the nonvolatile memory elements of the present invention are integrated.

If the memory element of the present invention is employed as the nonvolatile memory for adjusting the image of the LCD panel, the manufacturing cost can be reduced since the process of consolidation with the circuits of the LCD driver and so on is easy. Moreover, the semiconductor storage devices described in connection with the tenth and eleventh embodiments have a comparatively small memory scale and are particularly suitable for the case where reliability and stability are valued. Normally, the nonvolatile memory for adjusting the image of the LCD panel has a capacity of several kilobytes, and this memory scale is comparatively small. Therefore, it is especially preferable to employ the semiconductor storage device described in connection with the tenth or eleventh embodiment as the nonvolatile memory for adjusting the image of the LCD panel.

(Thirteenth Embodiment)

Figure 27:
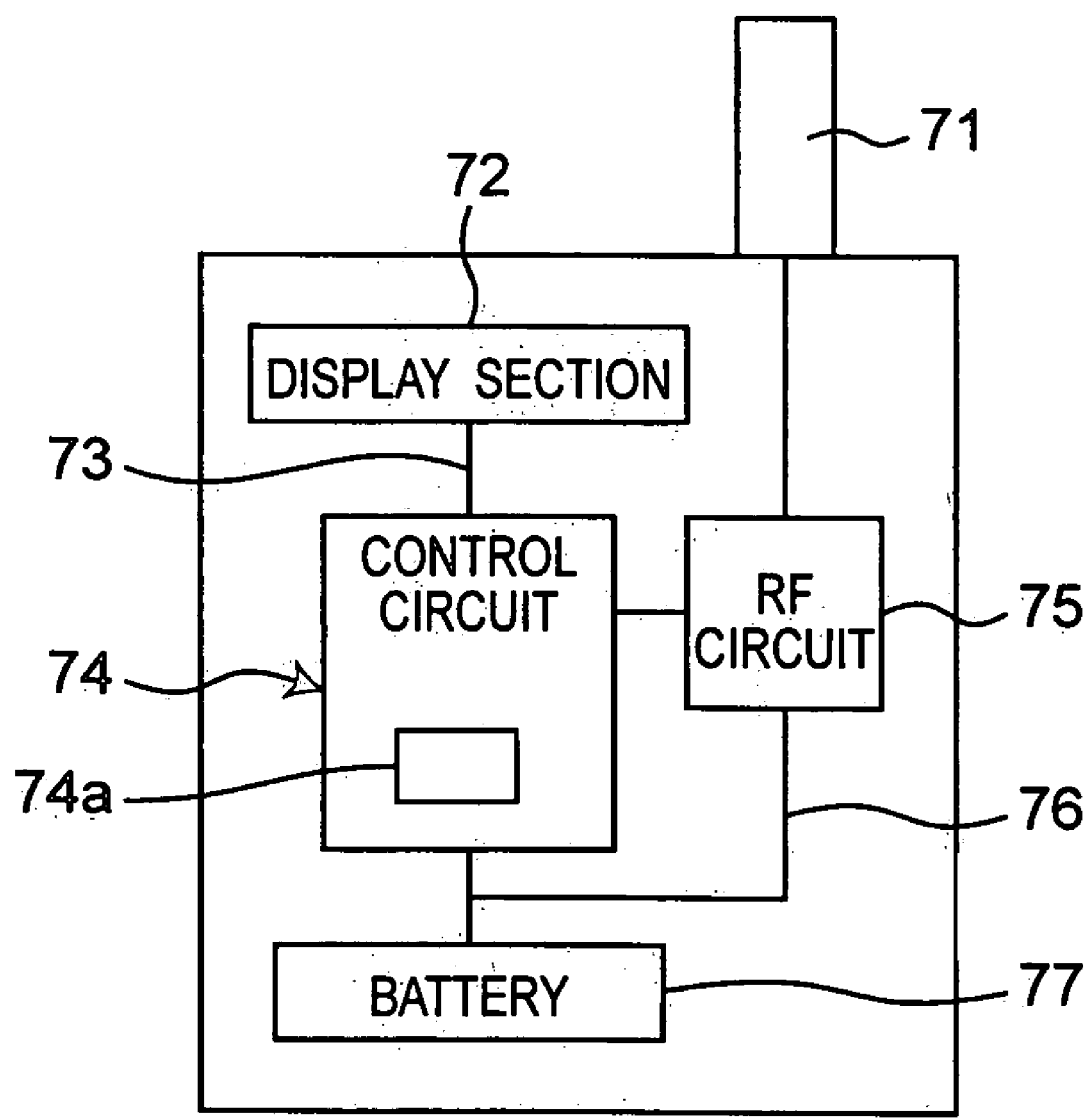
FIG. 27 is a block diagram of a portable telephone as one example of the portable electronic equipment of the thirteenth embodiment of the present invention.
Figure 28:
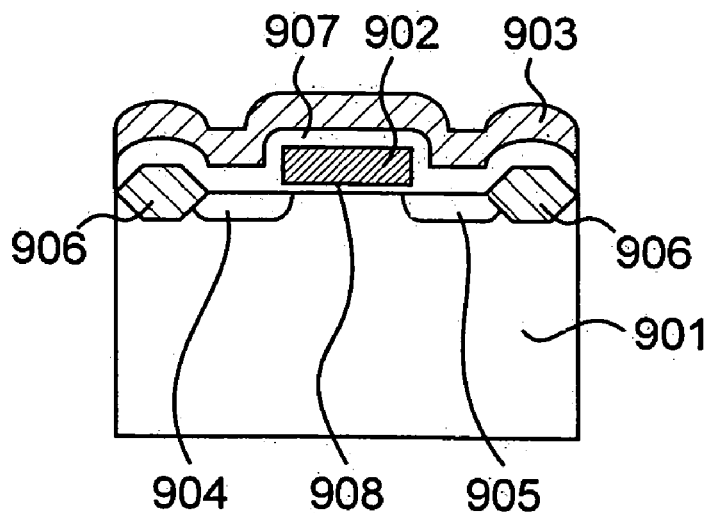
FIG. 28 is a schematic sectional view of the essential part of a conventional flash memory.

FIG. 27 shows a schematic block diagram of a portable telephone as one example of the portable electronic equipment of the thirteenth embodiment of the present invention.

As shown in FIG. 27, this portable telephone is provided with a control circuit 74, a battery 77, an RF (Radio Frequency) circuit 75, a display panel 72, an antenna 71, a signal line 73 and a power line 76. A semiconductor storage device 74a of the tenth or eleventh embodiment is integrated into the control circuit 74. The control circuit 74 should preferably be an integrated circuit where devices of an identical structure are concurrently used as a memory element and a logic circuit element. This facilitates the manufacturing of integrated circuits and allows the manufacturing cost of the portable electronic equipment to be especially reduced.

As described above, by employing the semiconductor storage device capable of storing two bits per transistor, being easily miniaturized and preventing the circuit malfunction in the portable electronic equipment, the portable electronic equipment can be miniaturized, and the reliability can be improved. Moreover, the manufacturing cost can be reduced by the miniaturization.

Moreover, the first through thirteenth embodiments employ the memory element constructed of the gate electrode formed on the semiconductor layer via the gate insulation film, the channel region arranged under the gate electrode, the diffusion regions that are arranged on both sides of the channel region and have the conductive type opposite to that of the channel region and the memory function bodies that are arranged on both sides of the gate electrode and have the function to retain electric charges, as a memory cell. However, the memory element employed as the memory cell is not limited to this.

The invention claimed is:

1. A semiconductor storage device having a memory cell array (21), which employs a memory element constructed of a gate electrode (1104) formed on a semiconductor layer (1102) via a gate insulation film (1103), a channel region (1121) arranged under the gate electrode (1104), diffusion regions (1107a, 1107b) that are arranged on both sides of the channel region (1121) and have a conductive type opposite to that of the channel region (1121), and memory function bodies (1105a, 1105b) that are formed on both sides of the gate electrode (1104) and have a function to retain electric charges, as a memory cell, the semiconductor storage device comprising:
a first switch (SW1) that has an input terminal to which an input voltage supplied from outside to the memory cell array is applied and has an output terminal connected to an input terminal of the memory cell array;
a second switch (SW2) that has an input terminal to which the input voltage is applied;
a charge pump (23) that has a pump input terminal connected to an output terminal of the second switch (SW2);
a third switch (SW3) that has an input terminal connected to a pump output terminal of the charge pump (23) and has an output terminal connected to the input terminal of the memory cell array (21);
an input voltage determining circuit (24) that determines whether or not the input voltage is not higher than a prescribed voltage; and
a control circuit (25) that turns on the first switch (SW1) and turns off the second and third switches (SW2, SW3) when the input voltage determining circuit (24) determines that the input voltage exceeds the prescribed voltage and turns off the first switch (SW1) and turns on the second and third switches (SW2, SW3) when the input voltage determining circuit determines that the input voltage is not higher than the prescribed voltage.

2. The semiconductor storage device as claimed in claim 1, wherein
each of the first, second and third switches (SW1, SW2, SW3) comprises:
a first P-channel field-effect transistor (31) that has a source forming an input terminal (Vin);
a second P-channel field-effect transistor (32) that has a drain connected to a drain of the first P-channel field-effect transistor (31) and a source forming an output terminal (Vout);
a first voltage level shifter (33) that selectively connects a gate of the first P-channel field-effect transistor (31) to either its source or ground according to a control signal from the control circuit (25); and
a second voltage level shifter (34) that selectively connects a gate of the second P-channel field-effect transistor (32) to either its source or ground according to a control signal from the control circuit (25).

3. The semiconductor storage device as claimed in claim 1, wherein
the prescribed voltage is a voltage within a range of +3 V to +12 V.

4. The semiconductor storage device as claimed in any one of claims 1 through 3, comprising:
a voltage polarity inverter circuit (26) that has an input terminal connected to the output terminal of the first switch (SW1) and inverts polarity of the voltage inputted to the input terminal to output the resulting voltage to the memory cell array (21).

5. The semiconductor storage device as claimed in claim 1, wherein at least part of the memory function bodies owned by the memory element overlaps with part of the diffusion region.

6. The semiconductor storage device as claimed in claim 1, comprising: an insulation film (1241), which separates a film (1242), that has a surface roughly parallel to a surface of the gate insulation film of the memory element and has a function to retain electric charges, from the channel region or the semiconductor layer (1211), the insulation film (1241) having a film thickness (T1) thinner than a film thickness (T2) of the gate insulation film (1214) and being not smaller than 0.8 nm.

7. Portable electronic equipment having the semiconductor storage device claimed in claim 1.

8. A semiconductor storage device having a memory cell array (21), which employs a memory element constructed of a gate electrode (1104) formed on a semiconductor layer (1102) via a gate insulation film (1103), a channel region (1121) arranged under the gate electrode (1104), diffusion regions (1107a, 1107b) that are arranged on both sides of the channel region (1121) and have a conductive type opposite to that of the channel region (1121), and memory function bodies (1105a, 1105b) that are formed on both sides of the gate electrode (1104) and have a function to retain electric charges, as a memory cell, a first switch (SW1) that has an input terminal to which the input voltage of negative polarity supplied from outside to the memory cell array (21) is applied and has an output terminal connected to the input terminal of the memory cell array (25);

a second switch (SW2) that has an input terminal to which the input voltage of the negative polarity is applied;

a charge pump (23) that has a pump input terminal connected to an output terminal of the second switch (SW2);

a third switch (SW3) that has an input terminal connected to a pump output terminal of the charge pump (23) and has an output terminal connected to the input terminal of the memory cell array (21);

an input voltage determining circuit (24) that determines whether or not the input voltage is not lower than a prescribed voltage; and a control circuit (25) that turns on the first switch (SW1) and turns off the second and third switches (SW2, SW3) when the input voltage determining circuit (24) determines that the input voltage is lower than the prescribed voltage and turns off the first switch (SW1) and turns on the second and third switches (SW2, SW3) when the input voltage determining circuit (24) determines that the input voltage is not lower than the prescribed voltage.

9. The semiconductor storage device as claimed in claim 8, wherein each of the first, second and third switches (SW1, SW2, SW3) comprises:

a first N-channel field-effect transistor (31) that has a source forming an input terminal (Vin);

a second N-channel field-effect transistor (32) that has a drain connected to a drain of the first N-channel field-effect transistor (31) and a source forming an output terminal (Vout);

a first voltage level shifter (33) that selectively connects a gate of the first N-channel field-effect transistor (31) to either its source or ground according to a control signal from the control circuit (25); and a second voltage level shifter (34) that selectively connects a gate of the second N-channel field-effect transistor (32) to either its source or ground according to a control signal from the control circuit (25).

10. The semiconductor storage device as claimed in claim 8, wherein the prescribed voltage is a voltage within a range of −3 V to −12 V.

11. A semiconductor storage device having a memory cell array (21), which employs a memory element constructed of a gate electrode (1104) formed on a semiconductor layer (1102) via a gate insulation film (1103), a channel region (1121) arranged under the gate electrode (1104), diffusion regions (1107a, 1107b) that are arranged on both sides of the channel region (1121) and have a conductive type opposite to that of the channel region (1121), and memory function bodies (1105a, 1105b) that are formed on both sides of the gate electrode (1104) and have a function to retain electric charges, as a memory cell, a first switch (SW1) that has an input terminal to which an input voltage of positive polarity supplied from outside to the memory cell array (21) is applied and has an output terminal connected to the input terminal of the memory cell array;

a second switch (SW2) that has an input terminal to which the input voltage of the positive polarity is applied;

a first charge pump (23) that has a pump input terminal connected to the output terminal of the second switch;

a third switch (SW3) that has an input terminal connected to an output terminal of the first charge pump (23) and has an output terminal connected to the input terminal of the memory cell array (21);

a first input voltage determining circuit (24) that determines whether or not the input voltage of the positive polarity is not higher than a first prescribed voltage;

a first control circuit (25) that turns on the first switch (SW1) and turns off the second and third switches (SW2, SW3) when the first input voltage determining circuit (24) determines that the input voltage of the positive polarity exceeds the first prescribed voltage and turns off the first switch (SW1) and turns on the second and third switches (SW2, SW3) when the first input voltage determining circuit determines that the input voltage of the positive polarity is not higher than the first prescribed voltage;

a fourth switch that has an input terminal to which an input voltage of negative polarity supplied from outside to the memory cell array is applied and has an output terminal connected to the input terminal of the memory cell array;

a fifth switch that has an input terminal to which the input voltage of the negative polarity is applied;

a second charge pump that has a pump input terminal connected to an output terminal of the fifth switch;

a sixth switch that has an input terminal connected to an output terminal of the second charge pump and has an output terminal connected to the input terminal of the memory cell array;

a second input voltage determining circuit that determines whether or not the input voltage of the negative polarity is not lower than a second prescribed voltage; and a second control circuit that turns on the fourth switch and turns off the fifth and sixth switches when the second input voltage determining circuit determines that the input voltage of the negative polarity is lower than the second prescribed voltage and turns off the fourth switch and turns on the fifth and sixth switches when the second input voltage determining circuit determines that the input voltage of the negative polarity is not lower than the second prescribed voltage.

12. The semiconductor storage device as claimed in claim 11, wherein each of the first, second and third switches (SW1, SW2, SW3) comprises:

a first P-channel field-effect transistor (31) that has a source forming an input terminal (Vin);

a second P-channel field-effect transistor (32) that has a drain connected to a drain of the first P-channel field-effect transistor (31) and a source forming an output terminal (Vout);

a first voltage level shifter (33) that selectively connects a gate of the first P-channel field-effect transistor (31) to either its source or ground according to a control signal from the first control circuit (25); and a second voltage level shifter (34) that selectively connects a gate of the second P-channel field-effect transistor (32) to either its source or ground according to a control signal from the first control circuit (25), wherein each of the fourth, fifth and sixth switches comprises:

a first N-channel field-effect transistor that has a source forming an input terminal;

a second N-channel field-effect transistor that has a drain connected to a drain of the first N-channel field-effect transistor and a source forming an output terminal;

a third voltage level shifter that selectively connects a gate of the first N-channel field-effect transistor to either its source or ground according to a control signal from the second control circuit; and a fourth voltage level shifter that selectively connects a gate of the second N-channel field-effect transistor to either its source or ground according to a control signal from the second control circuit.

13. The semiconductor storage device as claimed in claim 11, wherein the prescribed first voltage is a voltage within a range of +3 V to +12 V, and the prescribed second voltage is a voltage within a range of −3 V to −12 V.

14. A semiconductor storage device comprising:

a memory cell array (21);

a first switch (SW1) that has an input terminal to which an input voltage supplied from outside to the memory cell array is applied and has an output terminal connected to an input terminal of the memory cell array;

a second switch (SW2) that has an input terminal to which the input voltage is applied;

a charge pump (23) that has a pump input terminal connected to an output terminal of the second switch (SW2);

a third switch (SW3) that has an input terminal connected to a pump output terminal of the charge pump (23) and has an output terminal connected to the input terminal of the memory cell array (21);

an input voltage determining circuit (24) that determines whether or not the input voltage is not lower than a prescribed voltage; and a control circuit (25) that turns on the first switch (SW1) and turns off the second and third switches (SW2, SW3) when the input voltage determining circuit (24) determines that the input voltage is lower than the prescribed voltage and turns off the first switch (SW1) and turns on the second and third switches (SW2, SW3) when the input voltage determining circuit determines that the input voltage is not lower than the prescribed voltage.

15. A semiconductor storage device comprising:

a memory cell array (21);

a first switch (SW1) that has an input terminal to which an input voltage of positive polarity supplied from outside to the memory cell array (21) is applied and has an output terminal connected to the input terminal of the memory cell array;

a second switch (SW2) that has an input terminal to which the input voltage of the positive polarity is applied;

a first charge pump (23) that has a pump input terminal connected to the output terminal of the second switch;

a third switch (SW3) that has an input terminal connected to an output terminal of the first charge pump (23) and has an output terminal connected to the input terminal of the memory cell array (21);

a first input voltage determining circuit (24) that determines whether or not the input voltage of the positive polarity is not higher than a first prescribed voltage;

a first control circuit (25) that turns on the first switch (SW1) and turns off the second and third switches (SW2, SW3) when the first input voltage determining circuit (24) determines that the input voltage of the positive polarity exceeds the first prescribed voltage and turns off the first switch (SW1) and turns on the second and third switches (SW2, SW3) when the first input voltage determining circuit determines that the input voltage of the positive polarity is not higher than the first prescribed voltage;

a fourth switch that has an input terminal to which an input voltage of negative polarity supplied from outside to the memory cell array is applied and has an output terminal connected to the input terminal of the memory cell array;

a fifth switch that has an input terminal to which the input voltage of the negative polarity is applied;

a second charge pump that has a pump input terminal connected to an output terminal of the fifth switch;

a sixth switch that has an input terminal connected to an output terminal of the second charge pump and has an output terminal connected to the input terminal of the memory cell array;

a second input voltage determining circuit that determines whether or not the input voltage of the negative polarity is not lower than a second prescribed voltage; and a second control circuit that turns on the fourth switch and turns off the fifth and sixth switches when the second input voltage determining circuit determines that the input voltage of the negative polarity is lower than the second prescribed voltage and turns off the fourth switch and turns on the fifth and sixth switches when the second input voltage determining circuit determines that the input voltage of the negative polarity is not lower than the second prescribed voltage.

\* \* \* \* \*